US009021338B2

(12) United States Patent
Joo et al.

(10) Patent No.: US 9,021,338 B2
(45) Date of Patent: Apr. 28, 2015

(54) MEMORY SYSTEM AND DATA STORAGE METHOD

(75) Inventors: Sang-Hyun Joo, Hwaseongi-Si (KR); Kitae Park, Seongnam-Si (KR); Sangyong Yoon, Seoul (KR); Jaeyong Jeong, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 145 days.

(21) Appl. No.: 13/604,772

(22) Filed: Sep. 6, 2012

(65) Prior Publication Data
US 2013/0117634 A1 May 9, 2013

(30) Foreign Application Priority Data
Nov. 4, 2011 (KR) ........................ 10-2011-0114281

(51) Int. Cl.
| G06F 11/10 | (2006.01) |
| G11C 29/42 | (2006.01) |
| G06F 3/06 | (2006.01) |
| H03M 13/05 | (2006.01) |
| H03M 13/37 | (2006.01) |
| G06F 12/02 | (2006.01) |
| G06F 11/14 | (2006.01) |

(52) U.S. Cl.
CPC ............ *G06F 11/1048* (2013.01); *G11C 29/42* (2013.01); *G06F 11/1068* (2013.01); *G06F 12/0246* (2013.01); *G06F 3/0649* (2013.01); *G06F 11/14* (2013.01); *G06F 2212/72* (2013.01); *G06F 11/1402* (2013.01); *G06F 2212/7205* (2013.01); *H03M 13/05* (2013.01); *H03M 13/3715* (2013.01)

(58) Field of Classification Search
CPC ............ G06F 11/1402; G06F 3/0649; G06F 11/1068; G06F 2212/7205; G06F 11/14; G06F 12/0246; G06F 2212/72; G11C 29/42
See application file for complete search history.

(56) References Cited

U.S. PATENT DOCUMENTS

| 7,849,381 | B2 * | 12/2010 | Tomlin .......................... 714/763 |
| 8,060,797 | B2 | 11/2011 | Hida et al. |
| 2003/0021149 | A1 * | 1/2003 | So et al. .................... 365/185.03 |
| 2006/0156189 | A1 * | 7/2006 | Tomlin .......................... 714/763 |
| 2009/0241010 | A1 * | 9/2009 | Yano et al. .................... 714/764 |
| 2009/0307537 | A1 | 12/2009 | Chen et al. |
| 2009/0319859 | A1 * | 12/2009 | Alrod et al. .................... 714/752 |
| 2010/0193711 | A1 | 8/2010 | Watanabe et al. |
| 2010/0313084 | A1 * | 12/2010 | Hida et al. .................... 714/704 |
| 2010/0329030 | A1 | 12/2010 | You et al. |
| 2011/0072332 | A1 * | 3/2011 | Tomlin .......................... 714/763 |
| 2011/0231734 | A1 * | 9/2011 | Yano et al. .................... 714/764 |

(Continued)

FOREIGN PATENT DOCUMENTS

| JP | 2009-205578 | * 9/2009 | ............. G06F 12/16 |
| JP | 2011-029857 | 2/2011 | |

(Continued)

*Primary Examiner* — John P Trimmings
(74) *Attorney, Agent, or Firm* — Volentine & Whitt, PLLC

(57) ABSTRACT

A memory system comprises a nonvolatile memory device comprising a memory cell array comprising first and second memory blocks, and a memory controller configured to control the nonvolatile memory device to read data from the first memory block, selectively determine an error correction operation to be performed on the data after it is read from the first memory block based on a state of at least one of the first and second memory blocks, and then store the data in the second memory block.

17 Claims, 28 Drawing Sheets

(56) References Cited

U.S. PATENT DOCUMENTS

| | | | |
|---|---|---|---|
| 2011/0283058 A1* | 11/2011 | Araki et al. | 711/103 |
| 2012/0030528 A1* | 2/2012 | Hida et al. | 714/704 |
| 2013/0007343 A1* | 1/2013 | Rub et al. | 711/103 |
| 2013/0007353 A1* | 1/2013 | Shim et al. | 711/103 |
| 2013/0055047 A1* | 2/2013 | Sharon et al. | 714/764 |

FOREIGN PATENT DOCUMENTS

| | | |
|---|---|---|
| KR | 20110036816 A | 4/2011 |
| KR | 10-1039962 | 9/2011 |

* cited by examiner

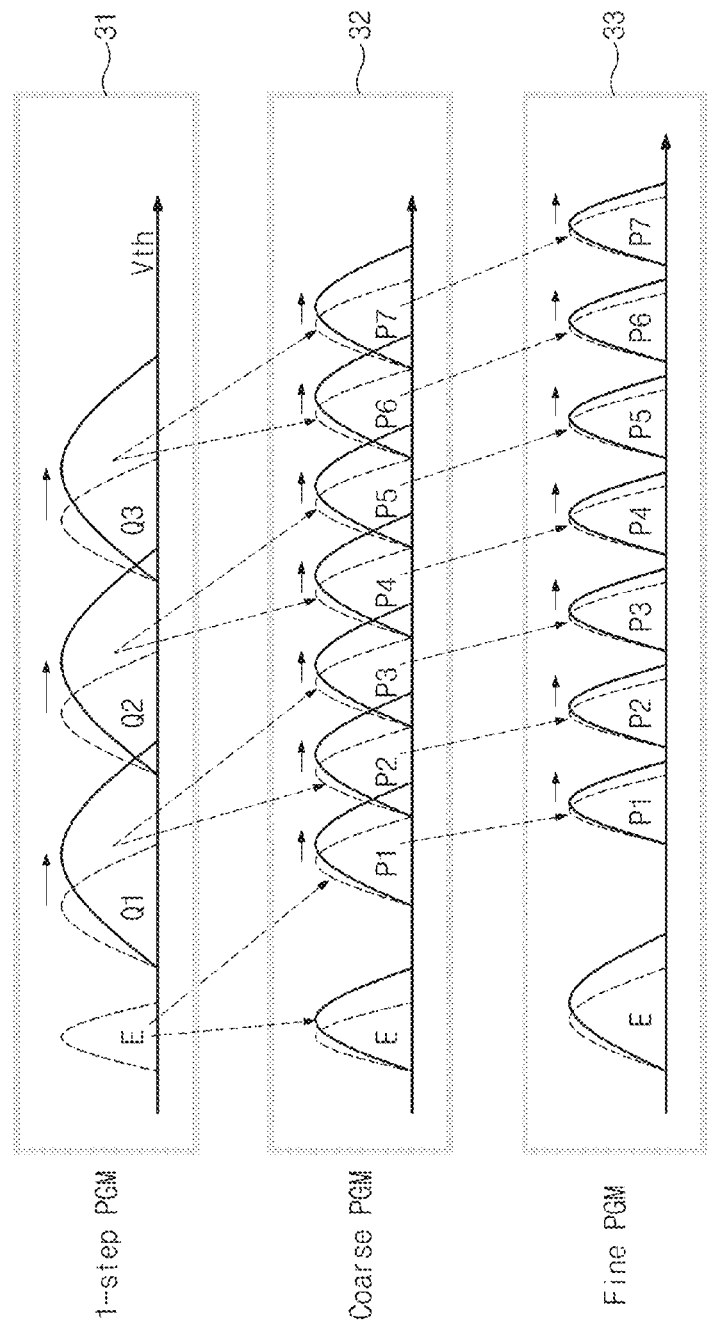

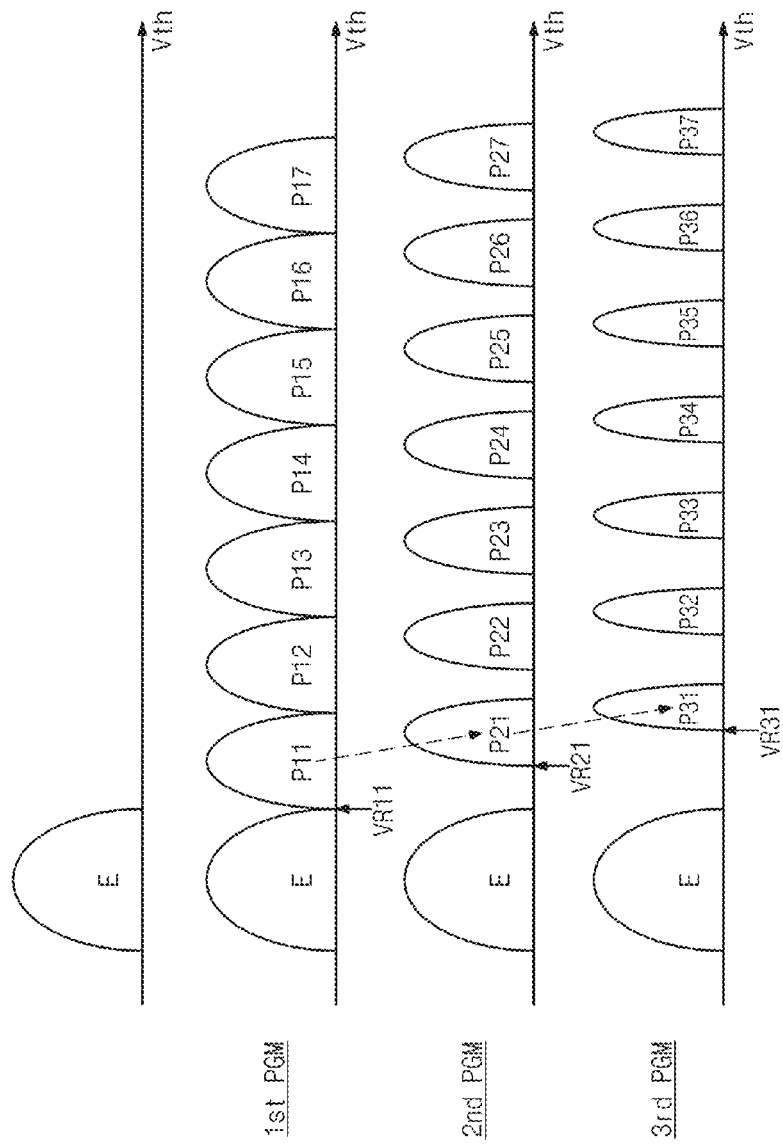

MEMORY SYSTEM AND DATA STORAGE METHOD

CROSS-REFERENCE TO RELATED APPLICATIONS

This application claims priority under 35 U.S.C §119 to Korean Patent Application No. 10-2011-0114281 filed on Nov. 4, 2011, the subject matter of which is hereby incorporated by reference.

BACKGROUND OF THE INVENTION

The inventive concept relates generally to electronic memory technologies. More particularly, the inventive concept relates to a memory system comprising a nonvolatile memory device, and related methods of operation.

Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include dynamic random access memory (DRAM) and static random access memory (SRAM). Examples of nonvolatile memory include mask read only memory (MROM), programmable read-only memory (PROM), erasable programmable read-only memory (EPROM), and electrically erasable programmable read-only memory (EEPROM).

In certain types of nonvolatile memory, such as flash EEPROM, the reliability of memory cells may decrease over time due to limited program or erase endurance. In other words, the memory cells may begin to fail after they have been programmed or erased a certain number of times. Consequently, there is a general need to provide improved techniques to address the effects of limited program or erase endurance.

SUMMARY OF THE INVENTION

In one embodiment of the inventive concept, a memory system comprises a nonvolatile memory device comprising a memory cell array comprising first and second memory blocks, and a memory controller configured to control the nonvolatile memory device to read data from the first memory block, selectively determine an error correction operation to be performed on the data after it is read from the first memory block based on a state of at least one of the first and second memory blocks, and then store the data in the second memory block.

In another embodiment of the inventive concept, a method of operating a nonvolatile memory device comprises reading data from a first memory block of the nonvolatile memory device, detecting a state of the first memory block or a second memory block of the nonvolatile memory device, where the detected state has a first value, performing an error correction operation on the data, and thereafter storing the data in the second memory block, and where the detected state has a second value, storing the data in the second memory block without performing the error correction operation.

These and other embodiments of the inventive concept can potentially improve the performance and power consumption of a nonvolatile memory devices and systems incorporating the nonvolatile memory devices.

BRIEF DESCRIPTION OF THE DRAWINGS

The drawings illustrate selected embodiments of the inventive concept. In the drawings, like reference numbers indicate like features.

FIG. 1B is a diagram showing variation of threshold voltage distributions when a program operation is performed according to 3-step programming to store 3-bit data in each memory cell.

FIG. 1C is a diagram illustrating a program operation performed with a reprogramming method according to another embodiment of the inventive concept.

DETAILED DESCRIPTION

Figure 1A:
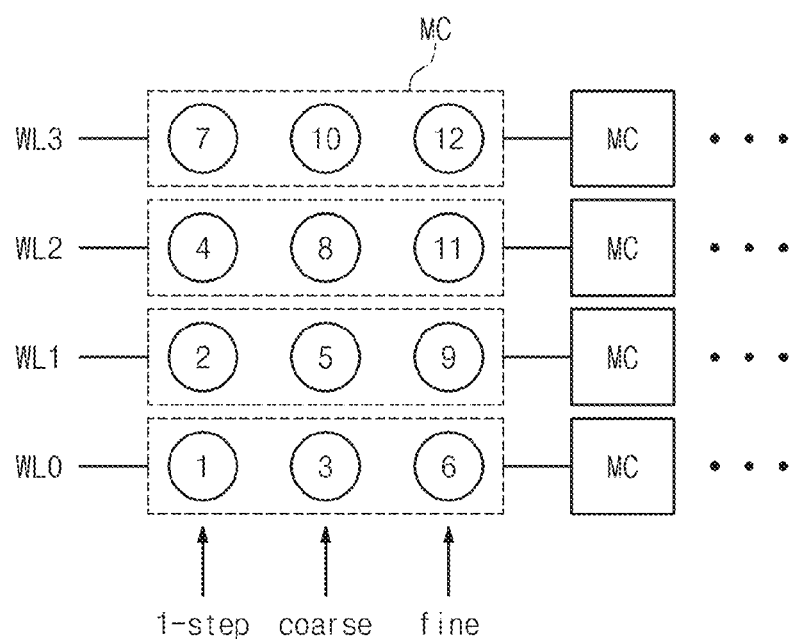
FIG. 1A is a diagram for describing an example of an address scramble method applied to a multi-level memory device.

Embodiments of the inventive concept are described below with reference to the accompanying drawings. These embodiments are presented as teaching examples and should not be construed to limit the scope of the inventive concept.

In the description that follows, the terms first, second, third, etc. may be used to describe various features, but the described features should not be limited by these terms. Rather, these terms are used merely to distinguish between different features. Thus a first feature could alternatively be termed a second feature and vice versa without changing the basic meaning of the relevant description.

Spatially relative terms, such as "below", "lower", "under", "above", "upper" and the like, may be used herein for ease of description to describe relationships between different features as illustrated in the drawings. The spatially relative terms are intended to encompass different orientations of the device in use or operation in addition to the orientation depicted in the drawings. For example, if the device in the drawings is turned over, features described as "below" or "under" other features would then be oriented "above" the other features. Thus, the terms "below" and "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, indicate the presence of stated features, but do not preclude the presence or addition of one or more other features. As used herein, the term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the present specification and will not be interpreted in an idealized or overly formal sense unless expressly so defined herein.

FIG. 1A is a diagram for describing an example of an address scramble method applied to a multi-level memory device.

With an increase in the number of data bits stored in each memory cell of the multi-level memory device, it becomes increasingly difficult to ensure the reliability of stored data. A representative factor causing decreased reliability may be a variation in threshold voltages due to coupling between adjacent memory cells. For example, a threshold voltage of a previously programmed memory cell may vary due to coupling caused when an adjacent memory cell is programmed.

An address scramble method will be described under the assumption that 3-bit data is stored in one memory cell. For simplicity, FIG. 1A illustrates only four wordlines WL0 to WL3, with a plurality of memory cells MC connected to each wordline. First of all, a 1-step program operation is performed in which lower 2-bit data is stored in each memory cell of a first wordline WL0. That is, during the 1-step program operation, 2-page data is stored in the memory cells connected with first wordline WL0, as indicated by ① in FIG. 1A. Then, a 1-step program operation is performed with respect to memory cells connected with a second wordline WL1, as indicated by ② in FIG. 1A.

After the 1-step program operation is performed with respect to memory cells connected with second wordline WL1, a coarse program operation (or, a 2-step program operation) is performed with respect to memory cells connected to first wordline WL0 in which lower 2-bit data is programmed, as indicated by ③ in FIG. 1A. Following the coarse program operation of memory cells connected with first wordline WL0, the 1-step program operation is performed with respect to a third wordline WL2, as indicated by ④ in FIG. 1A.

After the 1-step program operation of third wordline WL2, the coarse program operation is performed to store upper 1-bit data in memory cells connected with second wordline WL1, as indicated by ⑤ in FIG. 1A. Thereafter, a fine program operation is performed on first wordline WL0, as indicated by ⑥ in FIG. 1A. Thereafter, the 1-step, coarse, and fine program operations are performed sequentially according to the above-described program order (refer to FIG. 1A). A method in which wordlines are selected according to the program order described in FIG. 1A is called an address scramble method. In general, the address scramble method is not limited to the particular order illustrated in FIG. 1A.

Once the 1-step program operation and the coarse program operation are completed, threshold voltage distributions (e.g., $2^M$ threshold voltage distributions) respectively corresponding to M-bit data (M being an integer of 2 or more) are formed. Although threshold voltage distributions are formed upon completion of the coarse program operation, margins between threshold voltage distributions are insufficient to distinguish threshold voltage distributions with precision. The fine program operation is performed to secure margins sufficient to distinguish threshold voltage distributions with precision. The fine program operation is performed to narrow a width of each threshold voltage distribution. During the fine program operation, verification voltages are used which are higher by a predetermined voltage compared with verification voltages of threshold voltage distributions used at the coarse program operation. It is possible to reduce the coupling between adjacent memory cells through the above-described program method, which is referred to as a reprogram method/algorithm.

In alternative embodiments, the above-described reprogram method for 3-bit data, i.e., the 1-step programming, coarse programming, and fine programming may be modified or adapted for use with 2-bit data or 4-bit data.

In the reprogram method, it is necessary to retain data stored in memory cells of an arbitrary wordline (i.e., memory cells connected to the arbitrary wordline) until the fine program operation is completed on those memory cells. For example, in some implementations, the 1-step program operation is performed according to data provided to a multi-bit memory device from a memory controller, and the coarse program operation is performed according to data stored through the 1-step program operation and data provided from the memory controller. The fine program operation is then performed based on data stored through the 1-step and coarse program operations.

Nevertheless, as described above, it is difficult to precisely read data stored through the 1-step and coarse program operations. Consequently, data necessary for the fine program operation must be provided to the multi-bit memory device from the memory controller. As a result, the memory controller is required to retain data stored in memory cells of an arbitrary wordline until the fine program operation is completed for those memory cells. This may require the memory controller to include a large buffer memory to retain data needed for the fine program operation. However, as will be described in further detail below, an On-chip Buffered Programming (OBP) technique may be applied to a memory system to reduce the capacity of a buffer memory.

FIG. 1B is a diagram showing variations of threshold voltage distributions where a program operation is performed according to 3-step programming to store 3-bit data in each memory cell. A program method using the 3-step programming will be more fully described below.

First, 2-page data (i.e., first and second page data) is concurrently stored in memory cells of a selected wordline (e.g., WL0 in FIG. 1A). As illustrated in a box 31 of FIG. 1B, memory cells in a threshold voltage distribution corresponding to an erase state E are programmed to have threshold voltages in threshold voltage distributions each corresponding to program states Q1, Q2, and Q3 based on data to be programmed.

As described above, a coarse program operation is performed on 1-step programmed memory cells of a wordline (e.g., WL0) after a 1-step program operation of memory cells in an adjacent wordline (e.g., WL1). As illustrated in box 31, distributions of 1-step programmed memory cells of the wordline (e.g., WL0) widen due to the coupling caused when memory cells in an adjacent wordline (e.g., WL1) are programmed.

Then, 1-page data is stored in memory cells of the selected wordline WL0. As illustrated in a box 32 of FIG. 1B, memory cells in a threshold voltage distribution corresponding to each state are programmed to have threshold voltages in corresponding threshold voltage distributions. For example, memory cells in a threshold voltage distribution corresponding to an erase state E may be programmed to have threshold voltages in a threshold voltage distributions corresponding to a program state P1, based on data to be programmed. Memory cells in a threshold voltage distribution corresponding to a program state Q1 may be programmed to have threshold voltages in threshold voltage distributions respectively corresponding to program states P2 and P3, based on data to be programmed. Memory cells in a threshold voltage distribution corresponding to a program state Q2 may be programmed to have threshold voltages in corresponding threshold voltage distributions to program states P4 and P5, based on data to be programmed. Memory cells in a threshold voltage distribution corresponding to a program state Q3 may be programmed to have threshold voltages in corresponding threshold voltage distributions to program states P6 and P7, based on data to be programmed.

As described above, a fine program operation of coarse programmed memory cells of a wordline (for example, WL0) may be performed after a 1-step program operation and a coarse program operation on memory cells of adjacent wordlines (e.g., WL2 and WL1). As illustrated by a box 32 of FIG. 1B, distributions of coarse programmed memory cells of the wordline (e.g., WL0) widen due to the coupling caused by the programming of memory cells of adjacent wordlines (e.g., WL2 and WL1). For this reason, it is difficult to precisely read data from coarse programmed memory cells.

Memory cells of wordline WL0 may be programmed to have final threshold voltage distributions P1 to P7 as illustrated in a box 33 of FIG. 1B. This operation is referred to as a fine program operation. As described above, the fine program operation requires previously programmed data (e.g., first to third page data). Because it is difficult to read previously programmed data from memory cells of wordline WL0, the fine program operation is performed based on data provided from a memory controller (or, data maintained by a memory device). As illustrated in a box 33 of FIG. 1B, distributions of fine programmed memory cells widen due to the coupling caused when memory cells in adjacent wordlines are programmed.

Afterwards, a 1-step program operation, a coarse program operation, and a fine program operation are performed on each wordline according to a program order (or, sequence) described in FIG. 1A, which will be performed in the same method as described in FIG. 1B.

FIG. 1C is a diagram illustrating a program operation performed with a reprogramming method according to another embodiment of the inventive concept. In particular, FIG. 1C, shows an example where 3-bit data (or, 3-page data) is programmed according to a reprogramming method, but it is well understood that the reprogramming method is not limited to 3-bit data. The reprogramming method of FIG. 1C comprises first programming, second programming, and third programming, as described below.

Referring to FIG. 1C, in the first programming, respective memory cells are programmed to one of eight states E and P11 to P17 from an erase state E. The eight states E and P11 to P17, as illustrated in FIG. 1C, can be adjacent to one another without read margins. In other words, 3-bit data may be roughly programmed by the first programming. 3-bit data is then programmed in a first memory area via a buffer program operation, and is read from the first memory area at the first programming.

In some embodiments, the first programming is performed in an Incremental Step Pulse Programming (ISPP) method in which a program voltage is increased by an increment in successive program loops. Moreover, in some embodiments, the first programming comprises a verification operation. In the verification operation, at least one program state may be verified. For example, at the first programming, even program states P12, P14, and P16 are verified, while odd program states P11, P13, and P15, and P17 are not be verified. That is, the first programming may be completed where even program states P12, P14, and P16 are verify-passed.

The second programming is performed to reprogram first programmed states P11 to P17 to denser states P21 to P27. States P21 to P27, as illustrated in FIG. 1, are adjacent to one another with predetermined read margins. 3-bit data programmed in the first programming is reprogrammed in the second programming. As described above, 3-bit data used in the second programming may be equal to that used in the first programming, and it may be read from the first memory area. As illustrated in FIG. 1C, first-programmed state P11 may be reprogrammed to a state P21 in the second programming. As a result, a threshold voltage distribution corresponding to state P21 may become narrower than that corresponding to state P11. Accordingly, a verification voltage VR21 for verifying the second-programmed state P21 may be higher than a verification voltage VR11 for verifying the first-programmed state P11. The second programming is typically performed using the ISPP method.

In some embodiments, the second programming comprises a verification operation. All program states are verified in a verification operation of the second programming. That is, the second programming may be completed once all program states P21 to P27 are verify-passed.

The third programming is performed to reprogram second programmed states P21 to P27 to denser states P31 to P37. States P31 to P37, as illustrated in FIG. 1, are adjacent to one another with a predetermined read margin larger than that of the second programming. 3-bit data programmed in the second programming is reprogrammed in the third programming. As described above, 3-bit data used in the third programming may be equal to that used at the first/second programming, and may be read from the first memory area. In the third programming, second-programmed state P21 may be reprogrammed to a state P31. As a result, a threshold voltage distribution corresponding to the third-programmed state P31 may be narrower than that corresponding to the second-programmed state P21. Accordingly, a verification voltage VR31 for verifying the third-programmed state P31 may be higher than a verification voltage VR21 for verifying the second-programmed state P21. The third programming is typically performed using the ISPP method.

In some embodiments, all program states are verified in a verification operation of the third programming. That is, the third programming may be completed when all program states P31 to P37 are verify-passed.

The inventive concept is not limited to embodiments where 3-bit data is programmed in the first programming. For example, in some embodiments 2-bit data is programmed in the first programming. After 2-bit data is first programmed, second programming is performed to program 3-bit data. A 3-bit program operation illustrated in FIG. 1C may be performed in a 3-step reprogramming method. However, the inventive concept is not limited to this example either. In general, a program operation performed in a reprogramming method may include three programming operations performed to narrow a threshold voltage distribution corresponding to a data value to be stored (or, to finely form a threshold voltage distribution).

As described above, each of the first, second, and third programming may include setting up a page buffer with data to be programmed (e.g., 3-page data). This operation may be referred to as a data setup operation. That is, each programming may accompany a data setup operation.

Figure 2:
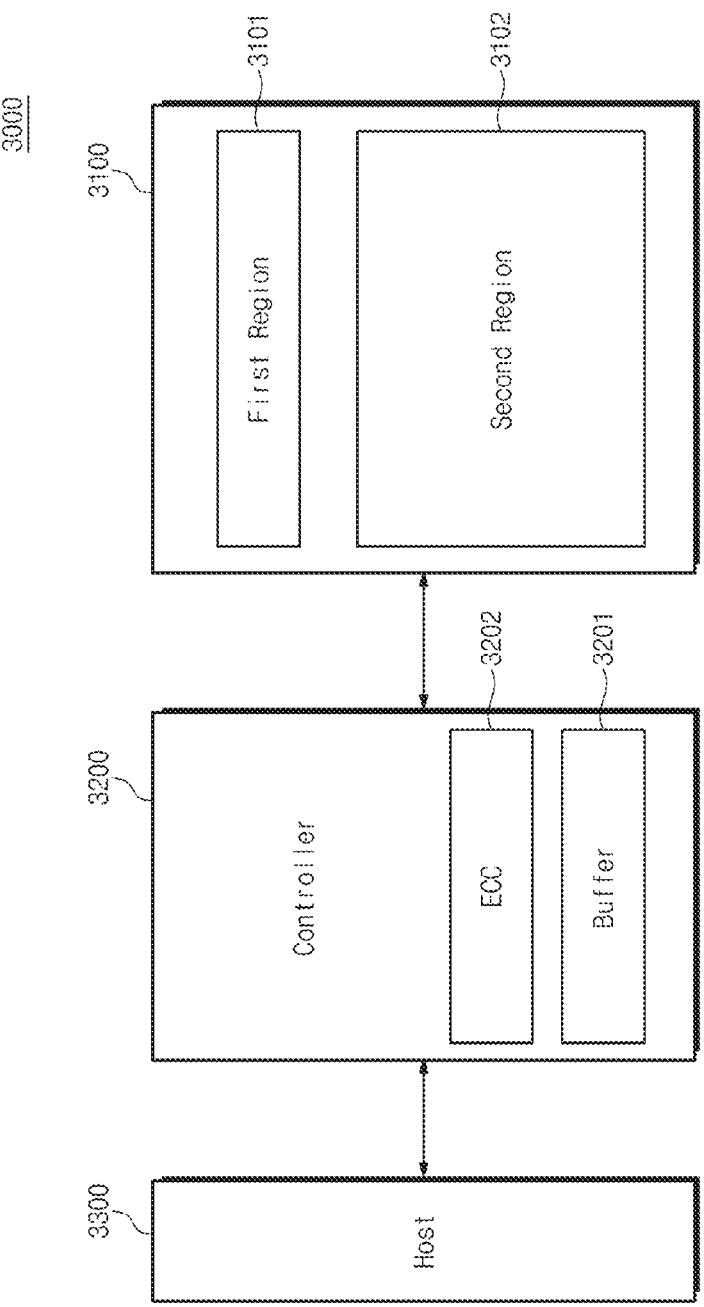
FIG. 2 is a block diagram of a data storage system according to an embodiment of the inventive concept.

FIG. 2 is a block diagram of a data storage system 3000 according to an embodiment of the inventive concept.

Referring to FIG. 2, data storage system 3000 comprises a multi-bit memory device 3100 as a non-volatile memory device, a memory controller 3200, and a host 3300. Multi-bit memory device 3100 can be formed of one or more memory chips. As a data storage device or a memory system, multi-bit memory device 3100 and memory controller 3200 may constitute a memory card, a Solid State Drive (SSD), a memory stick, or the like. Multi-bit memory device 3100 comprises a plurality of memory blocks (or, sectors/banks) each having memory cells arranged in rows and columns. Each of the memory cells stores multi-bit (or, multi-level) data. The memory cells are arranged with the 2-dimensional array structure or the 3-dimensional/vertical array structure. An example 3-dimensional array structure is disclosed in U.S. Publication Nos. 2008/0023747 and 2008/0084729, the respective disclosures of which are hereby incorporated by reference.

Memory blocks of multi-bit memory device 3100 are divided into a first memory region 3101 and a second memory region 3102. The division of first and second memory regions 3101 and 3102 is typically a logical rather than a physical division. Memory blocks in first memory region 3101 are programmed in a method different from memory blocks in second memory region 3102. For example, memory blocks in first memory region 3101 are programmed according to a single-bit program method (hereinafter, referred to as an SLC program method), and memory blocks in second memory region 3102 are programmed according to a multi-bit program method (hereinafter, referred to as an MLC program method). In other words, each memory cell in first memory region 3101 stores 1-bit data and each memory cell in second memory region 3102 stores M-bit data (M being an integer of 3 or more). As a result, data bits stored in each memory cell in first memory region 3101 may be less than M-bit data stored in each memory cell in second memory region 3102.

Memory controller 3200 is configured to control multi-bit memory device 3100 in response to a request of host 3300. Memory controller 3200 comprises a buffer memory 3201 and an ECC block 3202. Buffer memory 3201 is used to temporarily store data sent from host 3300 and data read out from multi-bit memory device 3100. ECC block 3202 is configured to encode data to be stored in multi-bit memory device 3100 and to decode data read out from multi-bit memory device 3100. The encoding may include an operation of generating parity information, and the parity information may be generated by a field unit. One-page data may be formed of one or more fields. The decoding may include an error detecting and correcting operation.

Memory controller 3200 controls a program operation of memory device 3100 using a static scheduling method. For example, where data of the minimum program unit for first memory region 3101 is stored in buffer memory 3201, memory controller 3200 controls multi-bit memory device 3100 such that data of the minimum program unit is stored (or, programmed) in first memory region 3101. This is called a buffer program operation. Where data of the minimum program unit for second memory region 3102 is gathered in first memory region 3101, memory controller 3200 controls multi-bit memory device 3100 such that data of the minimum program unit for second memory region 3102 is stored (or, programmed) in second memory region 3102. This is called a main program operation. The buffer program operation and the main program operation may constitute an OBP.

A main program operation accompanies two or more SLC read operations on first memory region 3101 for MLC programming on second memory region 3102. Memory controller 3200 performs an error detecting and correcting operation on data read via each SLC read operation. This may be performed to prevent error bits generated at first memory region 3101 from being stored in second memory region 3102 via the main program operation. In particular, memory controller 3200 may selectively perform an error detecting and correcting operation on data read via an SLC read operation, based on states of first memory region 3101 and/or second memory region 3102. This will be more fully described later. Thus, the performance of memory system 3100 and 3200 (or, data storage system 3000) is improved by selectively skipping an error detecting and correcting operation on data read via an SLC read operation. Further, power consumption due to a data input/output operation is reduced by selectively skipping an error detecting and correcting operation on data read via an SLC read operation.

In some embodiments, the minimum program unit for first memory region 3101 and the minimum program unit for second memory region 3102 may be determined variously depending upon a program method, a cell-per-bit number, and the like. The minimum program unit for first memory region 3101 is generally different from the minimum program unit for second memory region 3102.

In some embodiments, it is possible to reduce a size of buffer memory 3201 of memory controller 3200 by storing data in first memory region 3101 through the buffer program operation and storing data in second memory region 3102 through the main program operation. In other words, it is unnecessary to retain data for a fine program operation in buffer memory 3201. Accordingly, a size of buffer memory 3201 of memory controller 3200 is minimized.

FIGS. 3A to 3D are diagrams for describing various combinations on first and second memory regions of a multi-bit memory device according to an embodiment of the inventive concept. In these diagrams, "BP" indicates buffer programming in first memory region 3101, and "MP" indicates main programming in second memory region 3102.

As described above, multi-bit memory device 3100 comprises first memory region 3101 and second memory region 3102. First and second memory regions 3101 and 3102 constitute a memory cell array of multi-bit memory device 3100. Although not illustrated in drawings, the memory cell array may further comprise other regions, such as a metadata region, a reserved region, and the like. These regions are typically defined by logical divisions rather than physical divisions. This generally means that such regions of the memory cell array are defined according to address mapping of memory controller 3200.

Figure 3A:
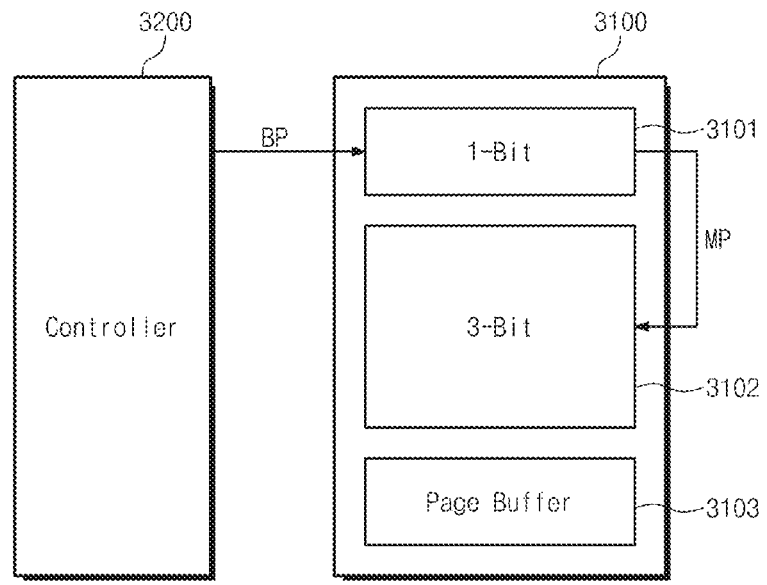
FIGS. 3A through 3D are diagrams for describing various combinations of first and second memory regions of a multi-bit memory device according to an embodiment of the inventive concept.

Referring to FIG. 3A, in a multi-bit memory device storing 3-bit data per cell, first memory region 3101 is formed of memory cells each storing 1-bit data, and second memory region 3102 is formed of memory cells each storing 3-bit data. In this case, buffer programming may be performed according to an SLC program method, and main programming may be performed according to the above-described MLC program method.

Figure 3B:
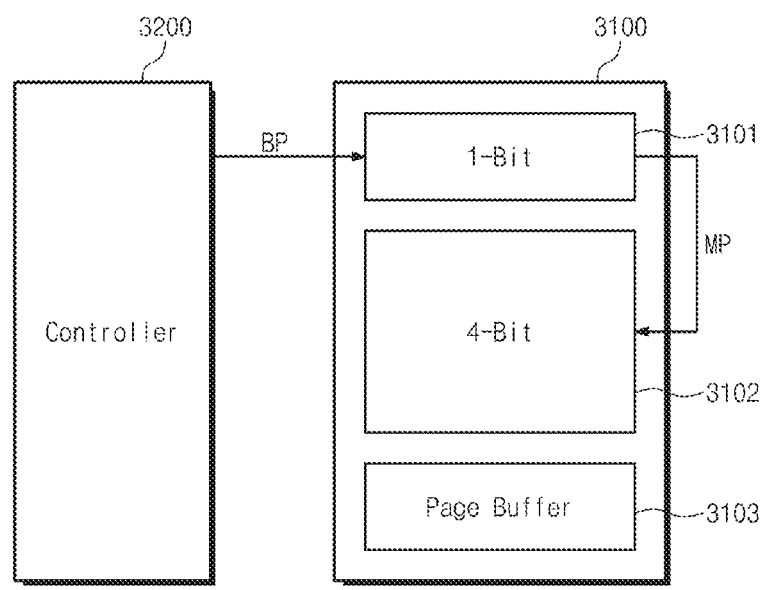

Referring to FIG. 3B, in a multi-bit memory device storing 4-bit data per cell, first memory region 3101 is formed of memory cells each storing 1-bit data, and second memory region 3102 is formed of memory cells each storing 4-bit data. In this case, buffer programming is performed according to an SLC program method, and main programming is performed according to the above-described MLC program method.

Figure 3C:
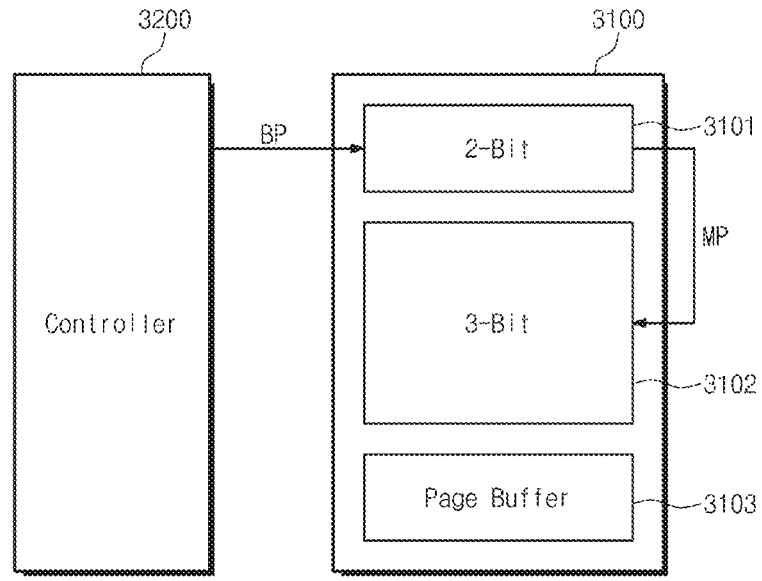

Referring to FIG. 3C, in a multi-bit memory device storing 3-bit data per cell, first memory region 3101 is formed of memory cells each storing 2-bit data, and second memory region 3102 is formed of memory cells each storing 3-bit data. In this case, buffer programming is performed according to the above-described or conventional MLC program method, and main programming is performed according to the above-described MLC program method (e.g., a reprogram method).

Figure 3D:
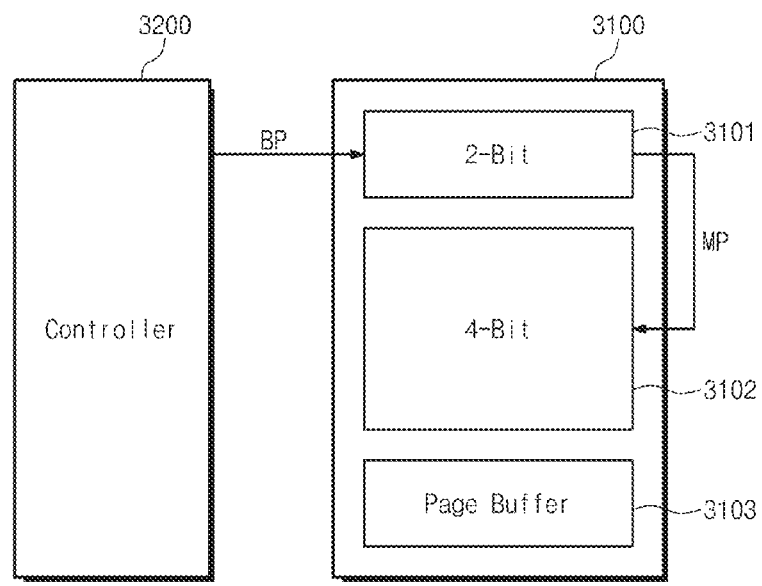

Referring to FIG. 3D, in a multi-bit memory device storing 4-bit data per cell, first memory region 3101 is formed of memory cells each storing 2-bit data, and second memory region 3102 is formed of memory cells each storing 4-bit data. In this case, buffer programming is performed according to the above-described or conventional MLC program method, and main programming may be made according to the above-described MLC program method (e.g., a reprogram method).

The definitions of first and second memory regions 3101 and 3102 is not limited to the examples of FIGS. 3A to 3D. For example, if a storage media in a data storage device is formed of a plurality of multi-bit memory devices, first and second memory regions 3101 and 3102 can be defined with respect to the respective multi-bit memory devices. Alternatively, first memory region 3101 can be defined with respect to any one of the multi-bit memory devices. Alternatively, any one multi-bit memory device can be defined as first memory region 3101.

Figure 4A:
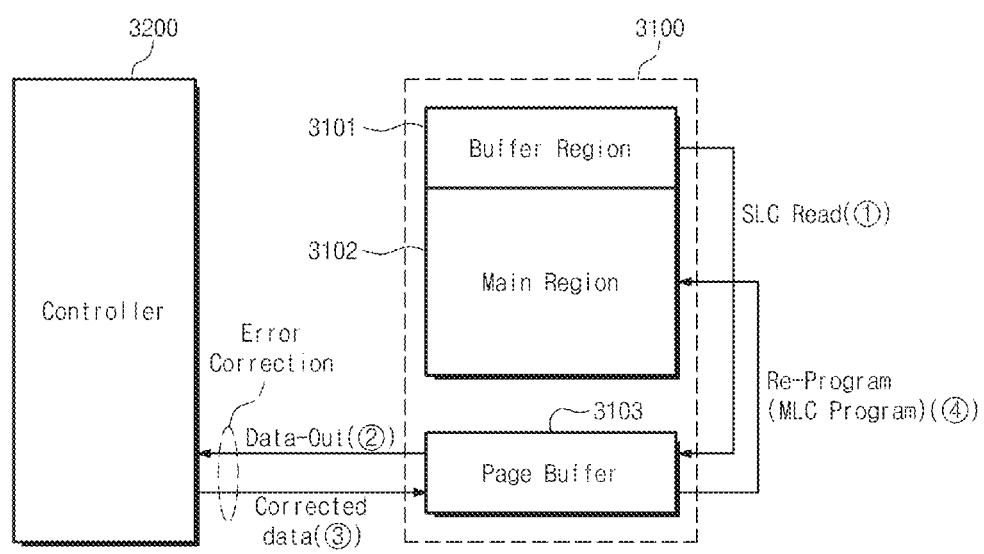
FIG. 4A is a diagram for describing a main program operation of a memory system according to an embodiment of the inventive concept.

FIG. 4A is a diagram for describing a main program operation of a memory system according to an embodiment of the inventive concept.

A main program operation is performed to move data stored in a buffer region 3101 as a first memory region into a main region 3102 as a second memory region, and includes two or more SLC read operations and a reprogram operation (or, an MLC program operation). In an SLC read operation, a page buffer 3103 reads data from memory cells of a selected page of buffer region 3101. The read data is sent to memory controller 3200. Memory controller 3200 performs an error detecting and correcting operation on the read data, and corrected data is loaded into page buffer 3103 under control of memory controller 3200. The error detecting and correcting operation is performed by ECC block 3202. The SLC read operation and the error detecting and correcting operation may be repeated according to the number of pages needed for the reprogram operation. Once page data needed for the reprogram operation is stored in page buffer 3103, the reprogram operation is performed under the control of memory controller 3200. That is, the data in page buffer 3103 (e.g., 2-page data or 3-page data) is programmed at main region 3102.

As described above, where an error detecting and correcting operation is performed whenever an SLC read operation is performed, the performance of a memory system may decrease. For this reason, memory controller 3200 selectively performs an error detecting and correcting operation based on a state of buffer region 3101 and/or main region 3102. Herein, the state of buffer region 3101 and/or main region 3102 may be determined according to various alternative bases, such as a program-erase cycle number of a memory block including a selected page of buffer region 3101, a wearing index of a selected page (or, a selected memory block) of buffer region 3101, a wearing index of a selected page (or, a selected memory block) of main region 3102, an error bit number of a part (e.g., data corresponding to one field in a selected page) of data of a selected page of buffer region 3101, and/or a combination of at least two of the above. This will be more fully described later. The wearing index may include, for instance, a program loop number, an erase loop number, and the like, which are provided from memory controller 3200. Values of the program-erase cycle number, the wearing index, and the like may be managed by memory controller 3200.

As a result, it is possible to improve the performance of a memory system and to reduce power consumption thereof by selectively performing an error detecting and correcting operation in view of a state of buffer region 3101 and/or main region 3102.

Figure 4B:
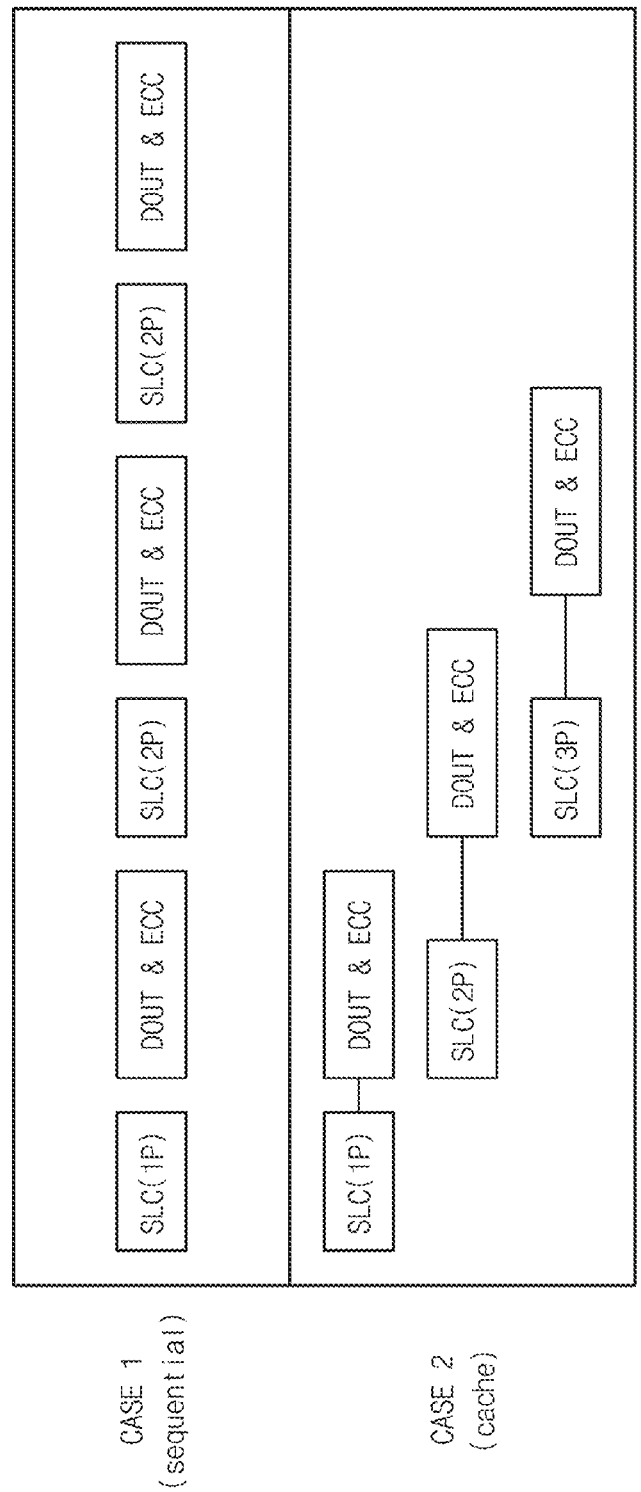
FIG. 4B is a diagram for describing various read and data output methods of the main program operation described with reference to FIG. 4A.

FIG. 4B is a diagram for describing various read and data output methods of a main program operation described in FIG. 4B. In the examples of FIG. 4B, page buffer 3103 may be set up with data for a main program operation according to a method described with reference to FIGS. 1A and 1B or a method described with reference to FIG. 1C. The main program operation may accompany two or more SLC read operations, and each SLC read operation and a data output operation for outputting read data may be performed according to a sequential method or a cache method.

In the sequential method, labeled "Case 1" in FIG. 4B, a page of data 1P is read from a buffer region (①). Then, the read data is output to memory controller 3200 for error detection and correction, and error-corrected data is sent to page buffer 3103 through a random data input operation (②, ③). After performance of the SLC read operation, the data output operation, and the random data input operation associated with the first page of data, an SLC read operation, a data output operation, and a random data input operation associated with a second page of data 2P are performed. Then, a reprogramming operation is performed (④).

In the cache method, labeled "Case 2" in FIG. 4B, a page of data 1P is read from a buffer region (①). Then, the read data is output to memory controller 3200 for error detection and correction, and error-corrected data is sent to page buffer 3103 through a random data input operation (②, ③). During the SLC read operation, the data output operation, and the random data input operation associated with the first page of data, an SLC read operation on a second page of data 2P may be performed as well. After the SLC read operation, the data output operation, and the random data input operation associated with the first page of data, a data output operation, and a random data input operation associated with a second page of data 2P may be performed. Likewise, while the SLC read operation, the data output operation, and the random data input operation associated with the second page of data are performed, an SLC read operation of a third page of data 3P is performed. After the SLC read operation, the data output operation, and the random data input operation associated with the second page of data are performed, a data output operation, and a random data input operation associated with a third page of data 3P are performed.

Figure 5:
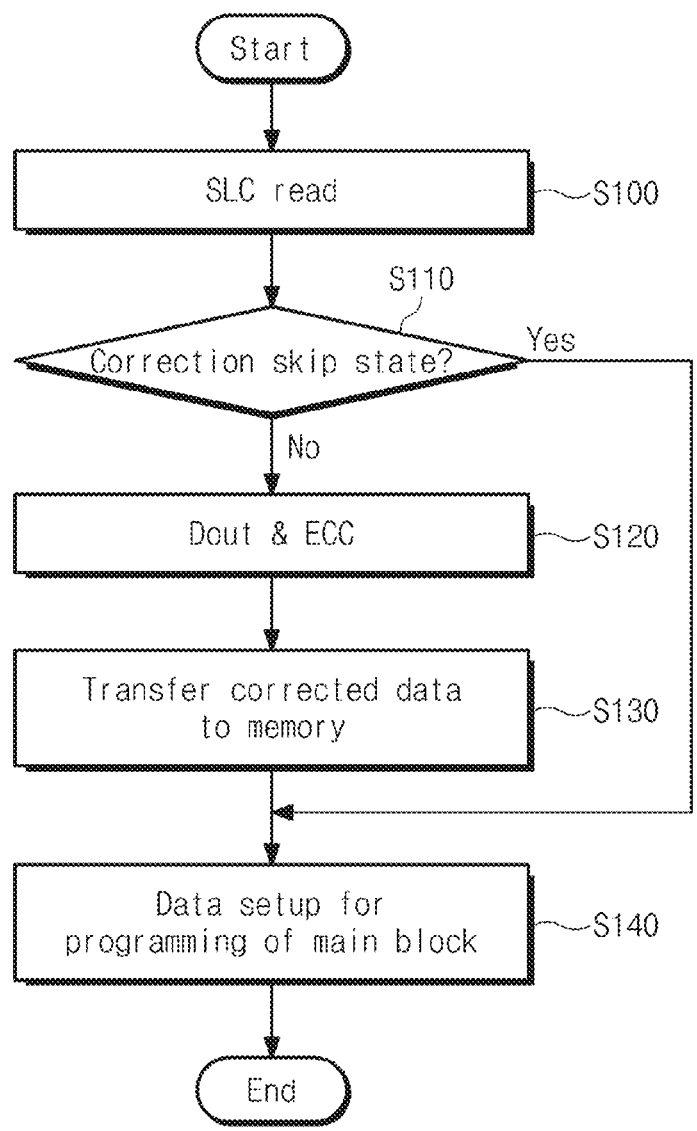
FIG. 5 is a flowchart for describing a main program operation of a memory system according to another embodiment of the inventive concept.

FIG. 5 is a flowchart for describing a main program operation of a memory system according to an embodiment of the inventive concept.

The main program operation starts under the control of memory controller 3200 when data of the minimum program unit is gathered at first memory region 3101. As described above, the main program operation may comprise two or more SLC read operations and a reprogram operation. For ease of description, a procedure associated with one SLC read operation is illustrated in FIG. 5.

In operation S100, data is read out from a selected page of first memory region 3101 via page buffer 3103. In operation S110, memory controller 3200 determines whether a state of a memory block of first memory region 3101 including the selected page, a state of a memory block of a second memory region 3102, in which data read from first memory region 3101 is being reprogrammed, or states of selected memory blocks of the first and second memory regions 3101 and 3102 are a correction skip state.

The determination of whether a state of a memory block is a correction skip state may be performed according to various references. For example, in some embodiments, the correction skip state is determined based on whether a first program-erase cycle number of a memory block of first memory region 3101 including a selected page reaches a reference value, whether a second program-erase cycle number of a memory block of a second memory region 3102, in which data read from first memory region 3101 is being reprogrammed, reaches the reference value, or whether a combination of the first and second program-erase cycle numbers reaches a reference condition. As an alternative, the correction skip state may be determined based on whether a first wearing index of a memory block of first memory region 3101 including a selected page reaches a reference value, whether a second wearing index of a memory block of a second memory region 3102, in which data read from first memory region 3101 is being reprogrammed, reaches the reference value, or whether a combination of the first and second wearing indexes reaches a reference condition.

In another alternative, the correction skip state is determined based on whether a program-erase cycle number of a memory block of first memory region 3101 including a selected page reaches a reference value and whether a wearing index of a memory block of a second memory region 3102, in which data read from first memory region 3101 is being reprogrammed, reaches the reference value. In yet another alternative, the correction skip state is determined based on whether a wearing index of a memory block of first memory region 3101 including a selected page reaches a reference value and whether a program-erase cycle number of a memory block of a second memory region 3102, in which data read from first memory region 3101 is being reprogrammed, reaches the reference value.

If the determination performed in operation S110 is affirmative (S110=Yes), the method proceeds to operation S140. Otherwise (S110=No), it proceeds to operation S120.

In operation S120, data read from first memory region 3101 is transferred to memory controller 3200, and memory controller 3200 performs an error detecting and correcting operation on the transferred data. In operation S130, corrected data is transferred to multi-bit memory device 3100. In operation S140, setup on the transferred data is made within page buffer 3103 for programming of main region 3102. For example, the transferred data may be stored in specific latches of page buffer 3103.

In some embodiments, operations S100 through S140 are repeated until all pages necessary for a reprogram operation are read from first memory region 3101. Thereafter, data (e.g., two or more pages) set up in page buffer 3103 may be programmed in main region (or, the second memory region) 3102.

As described in relation to FIG. 5, an error detecting and correcting operation of data read via an SLC read operation is selectively performed. Where the error detecting and correcting operation is skipped, an output of read data to memory controller 3200 is skipped. Consequently, the performance of a memory system is improved and power consumption is reduced.

In some embodiments, an operation of determining an error skip state is performed prior to an SLC read operation. If determined to be an error skip state, an SLC read operation and a data setup operation are performed. If determined not to be an error skip state, operations S100 to S140 may be sequentially performed.

Figure 6:
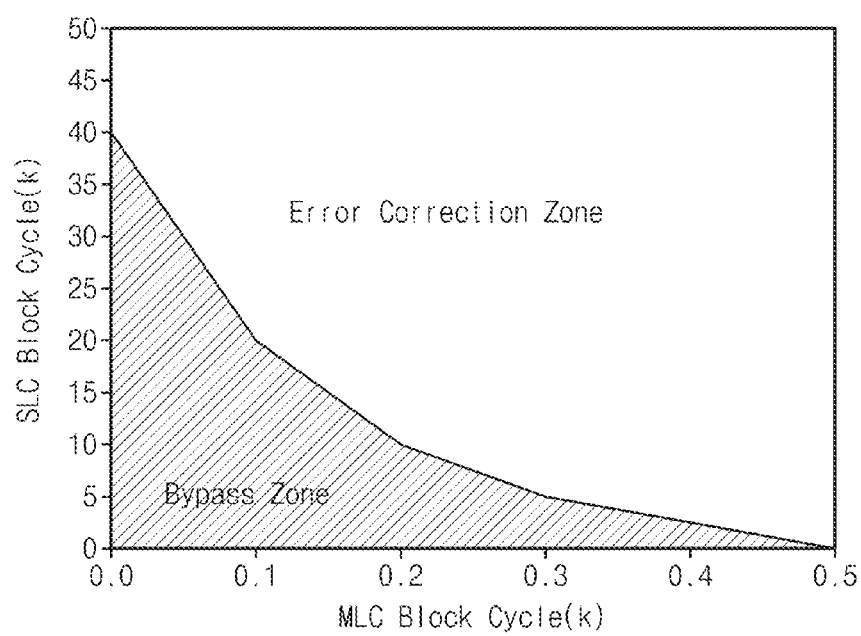
FIG. 6 is a diagram for describing a reference used to judge a correction skip state described in relation to FIG. 5.

FIG. 6 is a diagram for describing a reference which is used to judge a correction skip state described in FIG. 5. As illustrated in FIG. 6, a bypass zone and an error correction zone are determined according to a program-erase cycle number of an SLC block and a program-erase cycle number of an MLC block. An error correction operation is skipped in the bypass zone, while it is performed in the error correction zone.

In the example of FIG. 6, a bypass zone and an error correction zone are determined according to a program-erase cycle number of an SLC block and a program-erase cycle number of an MLC block. However, the inventive concept is not limited to this example. Alternatively, for instance, a bypass zone and an error correction zone can be determined according to a program-erase cycle number of an SLC block. A bypass zone and an error correction zone can be determined according to a program-erase cycle number of an MLC block. Although not shown in drawings, a bypass zone and an error correction zone can be determined according to a combination of a wearing index of an SLC block and a wearing index of an MLC block, a wearing index of an SLC block, or a wearing index of an MLC block. Alternatively, a bypass zone and an error correction zone can be determined according to a combination of a program-erase cycle number of an SLC block and a wearing index of an MLC block or a combination of a program-erase cycle number of an MLC block and a wearing index of an SLC block.

Figure 7A:
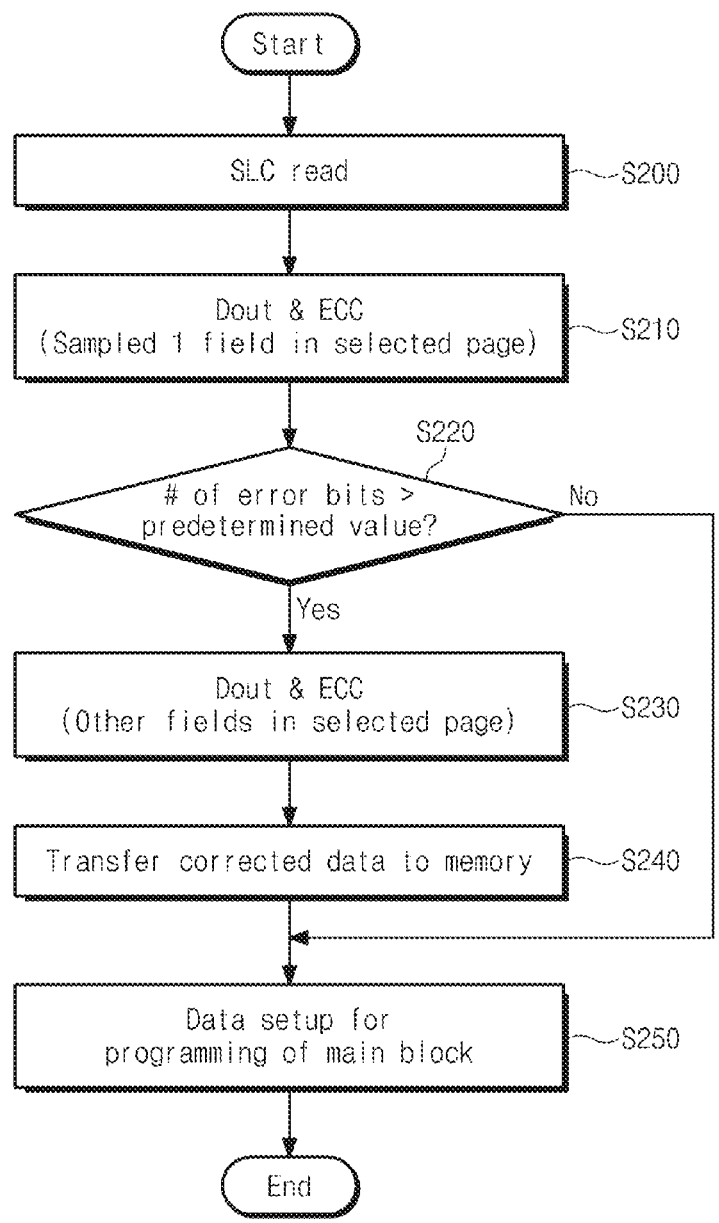
FIG. 7A is a flowchart for describing a main program operation of a memory system according to still another embodiment of the inventive concept.

FIG. 7A is a flowchart for describing a main program operation of a memory system according to another embodiment of the inventive concept.

As described above, a main program operation starts under the control of memory controller 3200 where data of a minimum program unit is gathered in first memory region 3101. The main program operation typically comprises two or more SLC read operations and a reprogram operation. For ease of description, a procedure associated with one SLC read operation is illustrated in FIG. 7A.

In operation S200, data is read out from a selected page of first memory region 3101 via page buffer 3103. One page is formed of at least two fields. As described above, ECC block 3202 of memory controller 3200 performs encoding and decoding by a field unit. In operation S210, data corresponding to one sample field among fields included in a selected page is sent to memory controller 3200, and ECC block 3202 performs an error detecting and correcting operation on the data corresponding to the sample field. In operation S220, memory controller 3200 determines whether an error bit number of data corresponding to the sample field exceeds a reference value. If the determination is negative (S220=No), the method proceeds to operation S250. Otherwise (S220=Yes), it proceeds to operation S230.

In operation S230, data corresponding to the remaining fields of the selected page is sent to memory controller 3200, and ECC block 3202 performs an error detecting and correcting operation on the transferred data (corresponding to the remaining fields). In operation S240, corrected data is sent to multi-bit memory device 3100. In operation S250, setup of the transferred data is performed within page buffer 3103 for programming of main region 3102.

The above-described operations S200 through S250 may be repeated until all pages necessary for a reprogram operation are read from first memory region 3101. Afterwards, data (e.g., two or more pages) set up in page buffer 3103 may be programmed in main region (or, the second memory region) 3102.

As described in relation to FIG. 7A, an error detecting and correcting operation is selectively performed on data read via an SLC read operation. Where the error detecting and correcting operation is skipped, an output of read data to memory controller 3200 is skipped. Consequently, the performance of a memory system is improved and power consumption thereof is reduced.

Figure 7B:
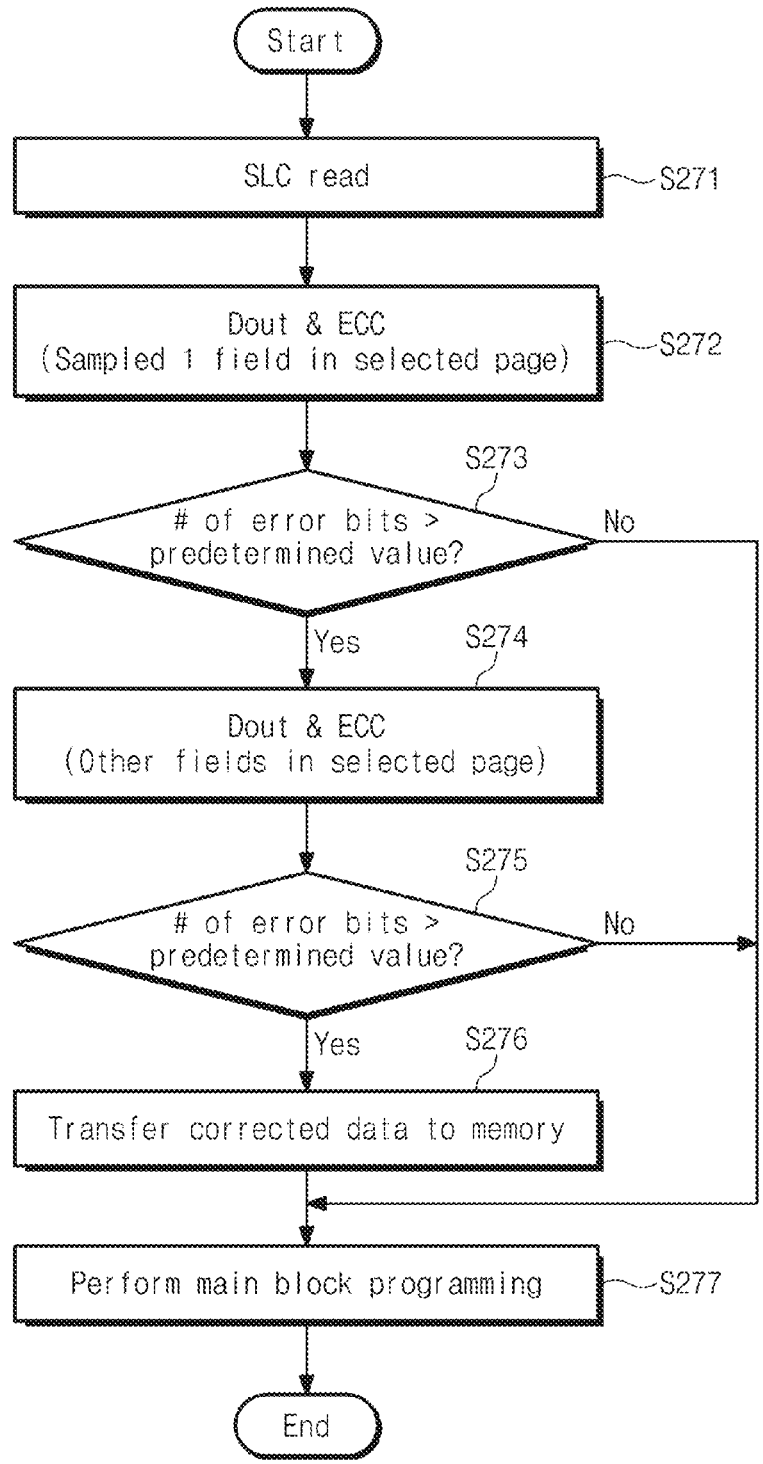
FIG. 7B is a flowchart for describing a main program operation of a memory system according to still another embodiment of the inventive concept.

FIG. 7B is a flowchart for describing a main program operation of a memory system according to still another embodiment of the inventive concept.

As described above, a main program operation starts under the control of memory controller 3200 when data of the minimum program unit is gathered in first memory region 3101. The main program operation may include two or more SLC read operations and a reprogram operation. For ease of description, a procedure associated with one SLC read operation is illustrated in FIG. 7B.

In operation S271, data is read out from a selected page of first memory region 3101 via page buffer 3103. One page is typically formed of at least two fields. As described above, ECC block 3202 of memory controller 3200 may perform encoding and decoding by a field unit. In operation S272, data corresponding to one sample field among fields in a selected page is sent to memory controller 3200, and ECC block 3202 performs an error detecting and correcting operation on the data corresponding to the sample field. In operation S273, memory controller 3200 determines whether an error bit number of data corresponding to the sample field exceeds a reference value. If the determination performed in operation S273 is negative (S273=No), the method proceeds to operation S277. Otherwise (S273=Yes), it proceeds to operation S274.

In operation S274, data corresponding to the remaining fields of the selected page is sent to memory controller 3200, and ECC block 3202 performs an error detecting and correcting operation on the transferred data (corresponding to the remaining fields). The error detecting and correcting operation is performed whenever data of a field unit is input. Operation S275 determines whether the number of erroneous bits in data of the field unit exceeds a reference value. Where the determination is affirmative (S275=Yes), the method proceeds to operation S276. Otherwise (S275=No), the method proceeds to operation S277.

In operation S276, corrected data is sent to multi-bit memory device 3100 through a random data input operation. In operation S277, setup on the transferred data is made within page buffer 3103 for programming of main region 3102. That is, a random data input operation on corrected data may be skipped. The random data input operation for sending corrected data may be selectively performed according to whether an error bit number of each field data exceeds a reference value. In general, reference values used in operations S273 and S275 can be set to the same value or different values.

The above-described operations S271 through S276 may be repeated until all pages necessary for a reprogram operation are read from first memory region 3101. Afterwards, data (e.g., two or more pages) stored in page buffer 3103 may be programmed in main region (or, the second memory region) 3102.

As described with reference to FIG. 7B, error correction and random data input associated with data read through an SLC read operation may be selectively performed. In the event that the error correction operation and the random data input operation are skipped, the performance of a memory system may be improved, and power consumption may be reduced.

Figure 8:
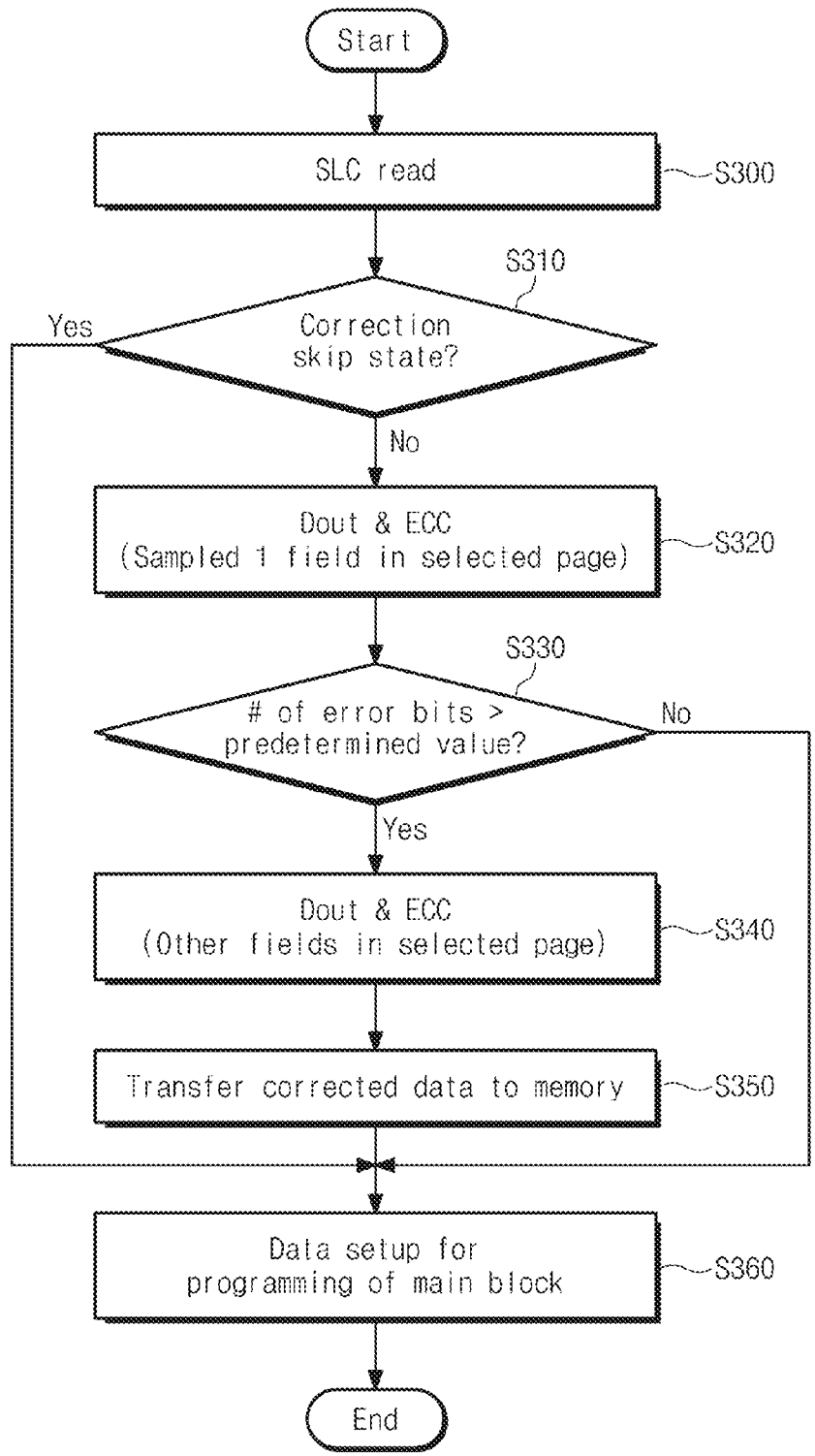
FIG. 8 is a flowchart for describing a main program operation of a memory system according to still another embodiment of the inventive concept.

FIG. 8 is a flowchart for describing a main program operation of a memory system according to still another embodiment of the inventive concept. The main program operation starts under the control of memory controller 3200 when data of the minimum program unit is gathered at first memory region 3101. The main program operation comprises two or more SLC read operations and a reprogram operation. For ease of description, a procedure associated with one SLC read operation is illustrated in FIG. 8.

In operation S300, data is read out from a selected page of first memory region 3101 via page buffer 3103. One page is typically formed of at least two fields. ECC block 3202 of memory controller 3200 performs encoding and decoding by field unit. In operation S310, memory controller 3200 determines whether a state of a memory block of first memory region 3101 including the selected page, a state of a memory block of a second memory region 3102, in which data read from first memory region 3101 is being reprogrammed, or states of selected memory blocks of the first and second memory regions 3101 and 3102 are a correction skip state. As described in relation to FIGS. 5 and 6, whether a state of a memory block is a correction skip state may be determined according to one or more of various references.

If the determination performed in operation S310 is affirmative (S310=Yes), the method proceeds to operation S360. Otherwise (S310=No), the method proceeds to operation S320. In operation S320, data corresponding to one sample field among fields in a selected page is sent to memory controller 3200, and ECC block 3202 performs an error detecting and correcting operation on the data corresponding to the sample field. In operation S330, memory controller 3200 determines whether an error bit number of data corresponding to the sample field exceeds a reference value. If the determination is negative (S330=No), the method proceeds to operation S360. Otherwise (S330=Yes), the method proceeds to operation S340.

In operation S340, data corresponding to the remaining fields of the selected page is sent to memory controller 3200, and ECC block 3202 performs an error detecting and correcting operation on the transferred data (corresponding to the remaining fields). In operation S350, corrected data is transferred to multi-bit memory device 3100. In operation S360, setup of the transferred data is performed within page buffer 3103 for programming of main region 3102.

Operations S300 through S360 are repeated until all pages necessary for a reprogram operation are read from first memory region 3101. Thereafter, data (e.g., two or more pages) set up in page buffer 3103 is programmed in main region (or, the second memory region) 3102.

As described in relation to FIG. 8, an error detecting and correcting operation is selectively performed on data read via an SLC read operation. Where the error detecting and correcting operation is skipped, an output of read data to memory controller 3200 is skipped. Accordingly, the performance of a memory system is improved and power consumption thereof is reduced.

In some embodiments, an operation of determining an error skip state is performed prior to an SLC read operation. When determined to be an error skip state, an SLC read operation and a data setup operation may be performed. If determined not to be an error skip state, operations S300 and S320 to S360 may be performed sequentially.

Figure 9:
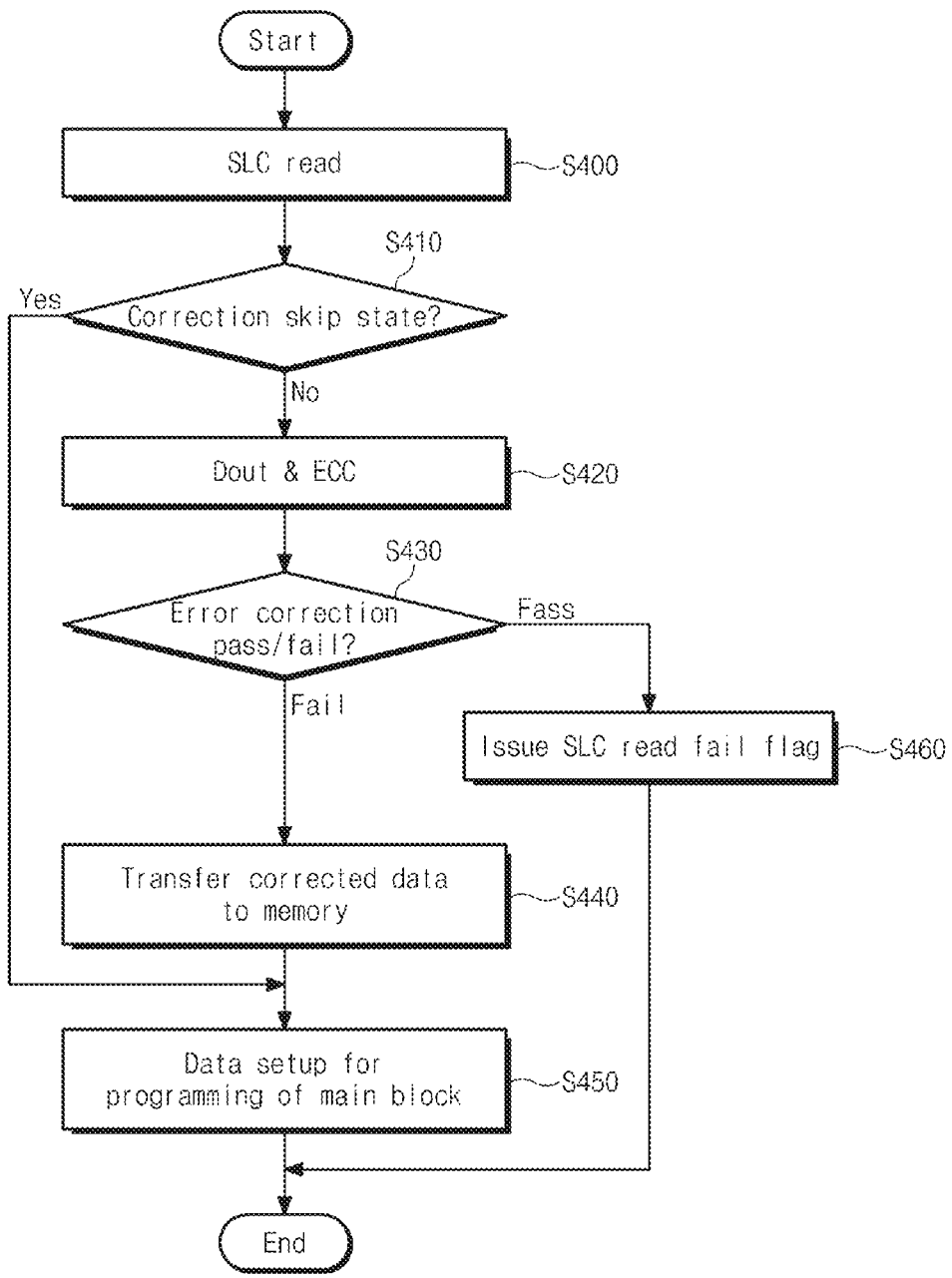
FIG. 9 is a flowchart for describing a main program operation of a memory system according to still another embodiment of the inventive concept.

FIG. 9 is a flowchart for describing a main program operation of a memory system according to still another embodiment of the inventive concept. The main program operation starts under the control of memory controller 3200 where data of the minimum program unit is gathered at first memory region 3101. The main program operation typically comprises two or more SLC read operations and a reprogram operation. For simplicity of explanation, a procedure associated with one SLC read operation is illustrated in FIG. 9.

In operation S400, data is read out from a selected page of first memory region 3101 via page buffer 3103. In operation S410, memory controller 3200 determines whether a state of a memory block of first memory region 3101 including the selected page, a state of a memory block of a second memory region 3102, in which data read from first memory region 3101 is being reprogrammed, or states of selected memory blocks of the first and second memory regions 3101 and 3102 are correction skip states. As described in relation to FIGS. 5 and 6, whether a state of a memory block is a correction skip state may be determined according to various alternative references or information sources.

Where the determination performed in operation S410 is positive (S410=Yes), the method proceeds to operation S450. Otherwise (S410=No), the method proceeds to operation S420. In operation S420, data read from first memory region 3101 is sent to memory controller 3200, and memory controller 3200 performs an error detecting and correcting operation on the transferred data.

In operation S430, memory controller 3200 determines whether an error correction operation is passed, i.e. successful. Where the error correction operation is passed (S430=Pass), the method proceeds to operation S460. Otherwise (S430=Fail), the method proceeds to operation S440. In operation S460, an SLC read fail flag is generated, and then the method ends. In operation S440, corrected data is transferred to multi-bit memory device 3100. In operation S450, setup of the transferred data is performed within page buffer 3103 for programming of main region 3102.

In general, operations S400 through S450 may be repeated until all pages necessary for a reprogram operation are read from first memory region 3101. Afterwards, data (e.g., two or more pages) set up in page buffer 3103 may be programmed in main region (or, the second memory region) 3102.

In some embodiments, an operation of judging an error skip state can be performed prior to an SLC read operation. Where the error skip state is detected, an SLC read operation and a data setup operation may be performed. Otherwise, the above-described operations S400 and S420 to S460 may be sequentially performed.

Figure 10:
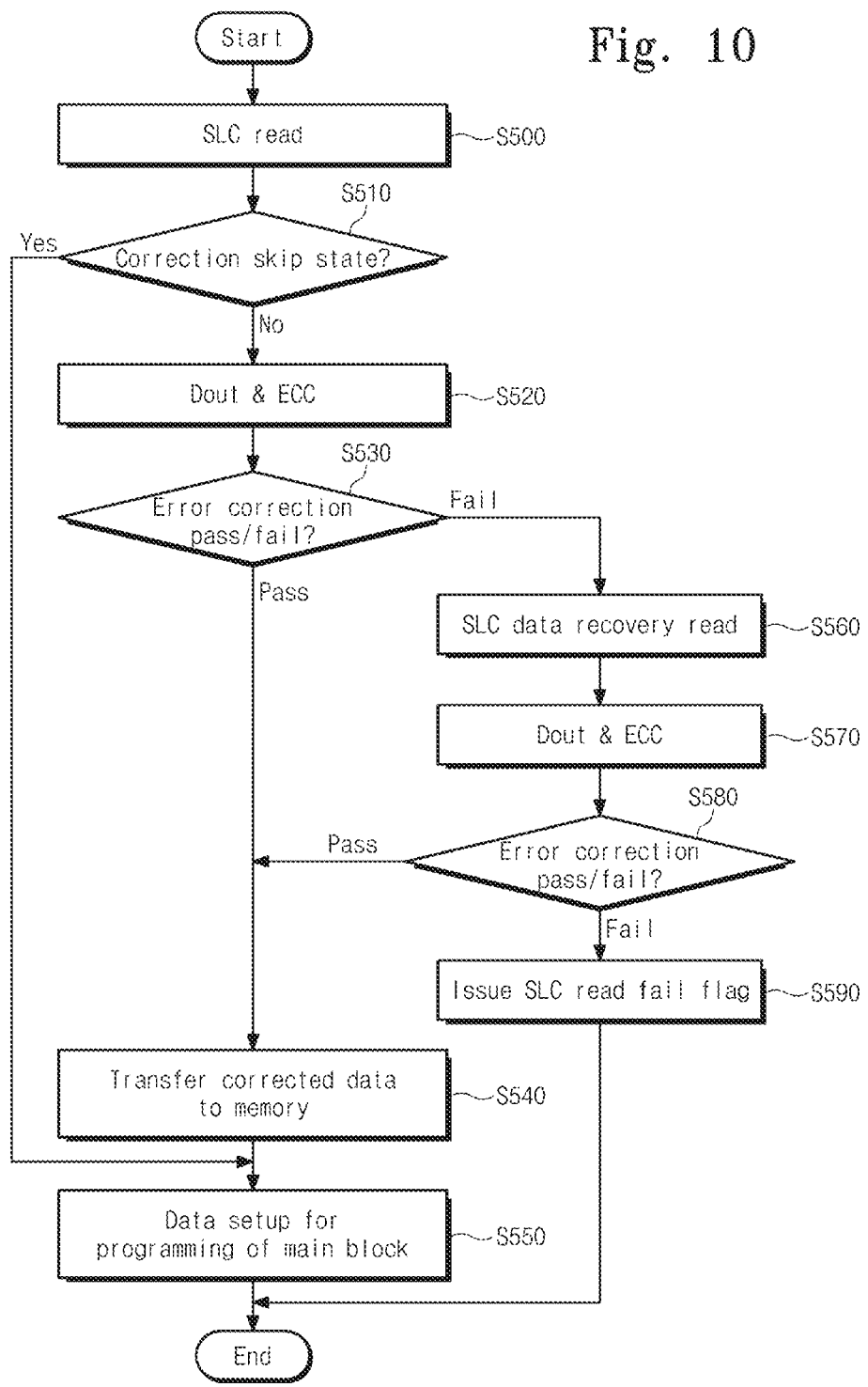
FIG. 10 is a flowchart for describing a main program operation of a memory system according to still another embodiment of the inventive concept.

FIG. 10 is a flowchart for describing a main program operation of a memory system according to still another embodiment of the inventive concept.

As described above, a main program operation starts under the control of memory controller 3200 when data of the minimum program unit is gathered in first memory region 3101. The main program operation may include two or more SLC read operations and a reprogram operation. For simplicity of description, a procedure associated with one SLC read operation is illustrated in FIG. 10.

In operation S500, data is read from a selected page of first memory region 3101 via page buffer 3103. In operation S510, memory controller 3200 determines whether a state of a memory block of first memory region 3101 including the selected page, a state of a memory block of a second memory region 3102, in which data read from first memory region 3101 is being reprogrammed, or states of selected memory blocks of the first and second memory regions 3101 and 3102 are a correction skip state. Whether a state of a memory block is a correction skip state may be determined according to various references as described in relation to FIGS. 5 and 6. If the determination is affirmative (S510=Yes), the method proceeds to operation S350. Otherwise (S510=No), the method proceeds to operation S520. In operation S520, data read from first memory region 3101 is sent to memory controller 3200, and memory controller 3200 performs an error detecting and correcting operation on the transferred data.

In operation S530, memory controller 3200 determines whether an error correction operation is passed. If so (S530=Pass), the method proceeds to operation S560. Otherwise (S530=Fail), the method proceeds to operation S540. In operation S540, corrected data is transferred to multi-bit memory device 3100. In operation S550, setup of the transferred data is performed within page buffer 3103 for programming of main region 3102.

In operation S560, an SLC data recover read operation is performed. In the SLC data recover read operation, a read operation is performed two times with respect to a threshold voltage distribution (or, a data state) (including a coupled distribution and an uncoupled distribution) using a first read voltage and a second read voltage to reduce a read error generated due to the wordline coupling. A read operation using the first read voltage may be performed to discriminate memory cells within the uncoupled distributions, and a read operation using the second read operation may be performed to discriminate memory cells within the coupled distributions. As a result, a read operation on memory cells of an upper wordline of a selected wordline (a wordline adjacent to a selected wordline) may be performed prior to read operations on memory cells of the selected wordline. The above-described read operations may be referred to as a data recover read operation. It is possible to read data precisely via the data recover read operation.

In operation S570, data read from first memory region 3101 via the SLC data recover read operation is sent to memory controller 3200, and memory controller 3200 performs an error detecting and correcting operation on the transferred data. In operation S580, memory controller 3200 determines whether an error correction operation is passed. Where the error correction operation is a failure (S580=Fail), the method proceeds to operation S590. Otherwise (S580=Pass), it proceeds to operation S540. In operation S590, an SLC read fail flag is generated. A procedure due to generation of the SLC read fail flag may be determined variously. Afterwards, the method is ended.

Operations S500 through S580 can be repeated until all pages necessary for a reprogram operation are read from first memory region 3101. Thereafter, data (e.g., two or more pages) set up at page buffer 3103 may be programmed at the main region (or, the second memory region) 3102.

In some embodiments, an operation of judging an error skip state can be performed prior to an SLC read operation. In this case, when determined to be an error skip state, an SLC read operation and a data setup operation may be performed. If determined not to be an error skip state, the above-described operations S500 and S520 to S590 may be sequentially performed.

FIG. 11 is a flowchart for describing a main program operation of a memory system according to still another embodiment of the inventive concept.

A main program operation starts under the control of memory controller 3200 when data of the minimum program unit is gathered at first memory region 3101. As described above, the main program operation may include two or more SLC read operations and a reprogram operation. For ease of description, a procedure associated with one SLC read operation is illustrated in FIG. 11.

Figure 11A:
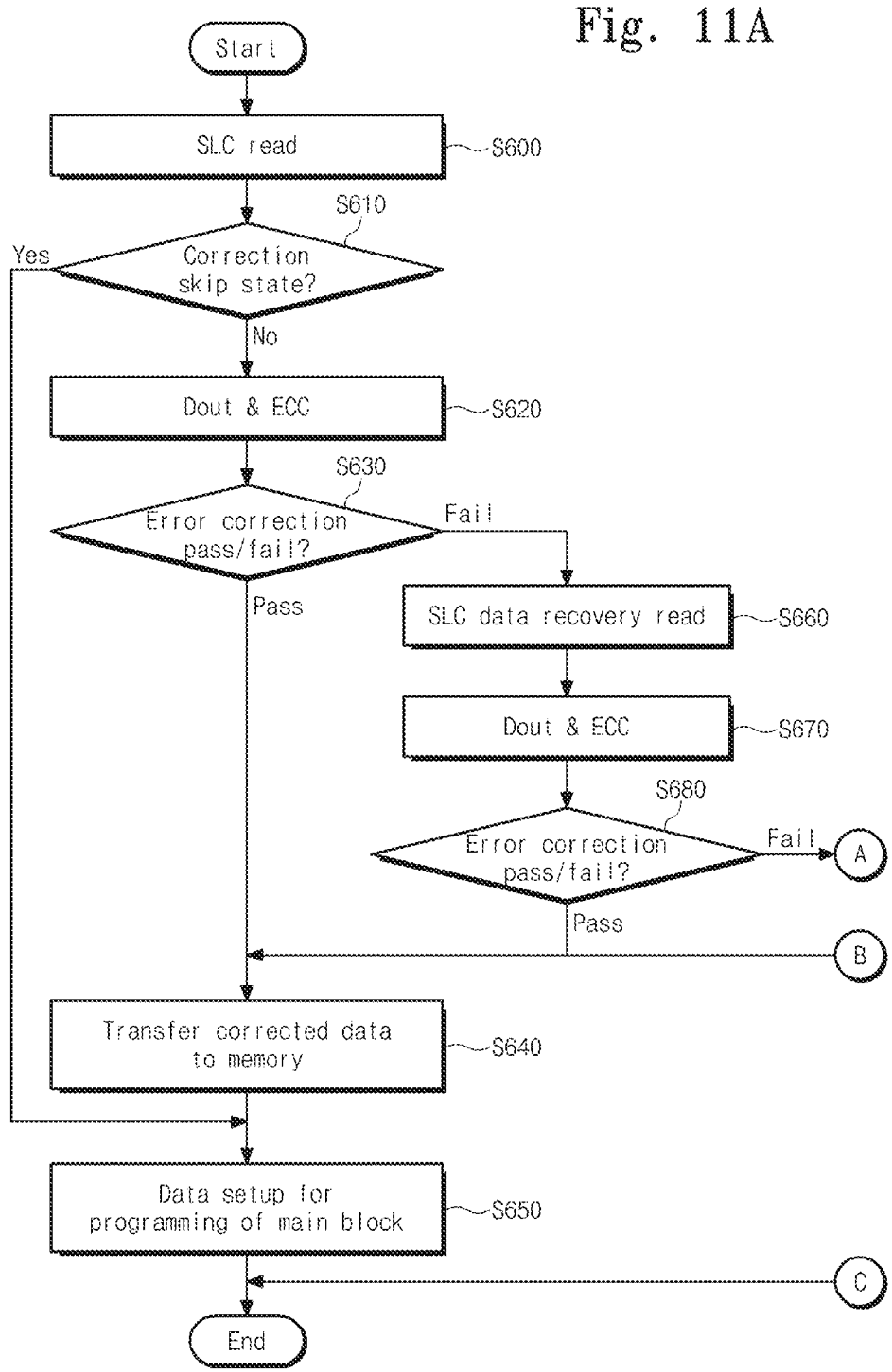
FIG. 11 is a flowchart for describing a main program operation of a memory system according to still another embodiment of the inventive concept.

Referring to FIG. 11A, in operation S600, data is read out from a selected page of first memory region 3101 via page buffer 3103. In operation S610, memory controller 3200 determines whether a state of a memory block of first memory region 3101 including the selected page, a state of a memory block of a second memory region 3102, in which data read from first memory region 3101 is being reprogrammed, or states of selected memory blocks of the first and second memory regions 3101 and 3102 are a correction skip state. Whether a state of a memory block is a correction skip state may be determined according to various references as described in relation to FIGS. 5 and 6.

If the determination performed in operation S610 is affirmative (S610=Yes), the method proceeds to operation S650. Otherwise (S610=No), the method proceeds to operation S620. In operation S620, data read from first memory region 3101 is sent to memory controller 3200, and memory controller 3200 performs an error detecting and correcting operation on the transferred data.

In operation S630, memory controller 3200 determines whether an error correction operation is passed. If so (S630=Pass), the method proceeds to operation S640. Otherwise (S630=Fail), the method proceeds to operation S660. In operation S640, corrected data is transferred to multi-bit memory device 3100. Then, in operation S650, setup on the transferred data is made within page buffer 3103 for programming of main region 3102.

In operation S660, an SLC data recover read operation is performed. The SLC data recover read operation is performed as described in relation to FIG. 10. In operation S670, data read from first memory region 3101 via the SLC data recover read operation is sent to memory controller 3200, and memory controller 3200 performs an error detecting and correcting operation on the transferred data.

In operation S680, memory controller 3200 determines whether an error correction operation is passed. If so (S680=Pass), the method proceeds to operation S640. Otherwise (S680=Fail), the method proceeds to operation S700.

Figure 11B:
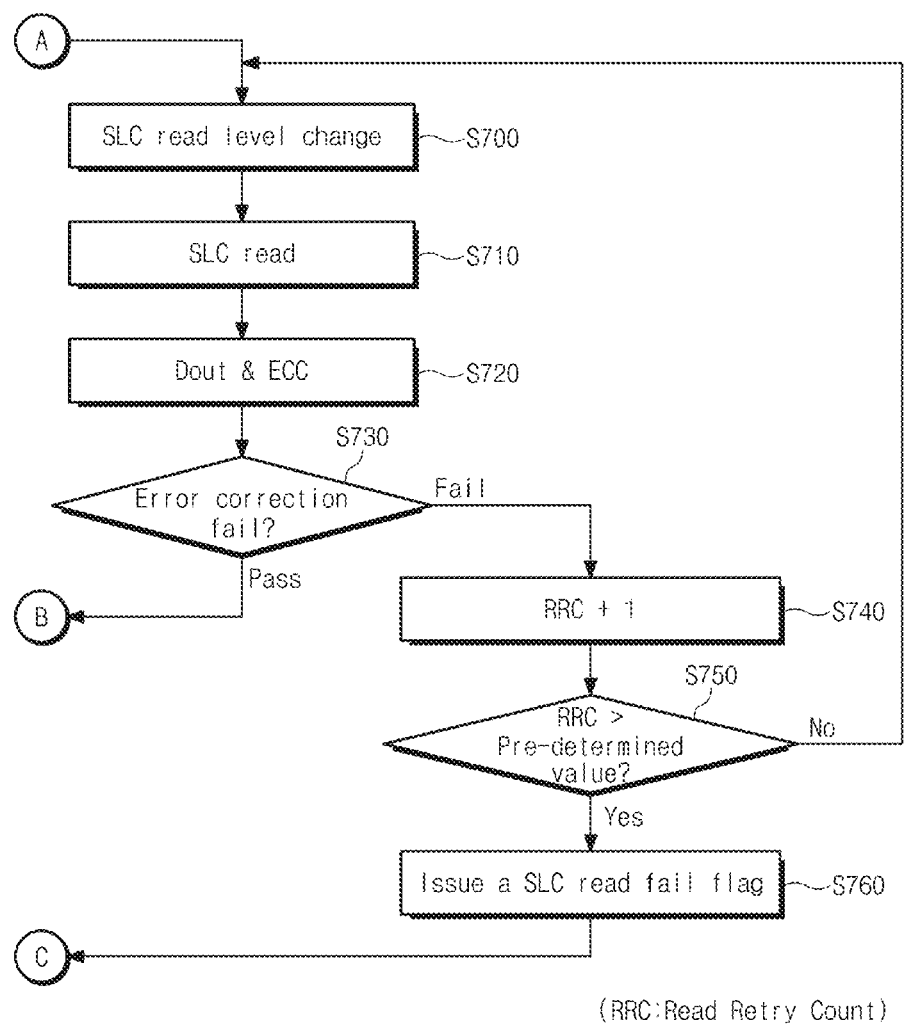

Referring to FIG. 11B, in operation S700, a read level of first memory region 3101 is changed under the control of memory controller 3200. In operation S710, an SLC read operation is performed using the changed read level. In operation S720, data read from first memory region 3101 using the changed read level is sent to memory controller 3200, and memory controller 3200 performs an error detecting and correcting operation on the transferred data. In operation S730, memory controller 3200 determines whether an error correction operation is passed. If so (S730=Pass), the method proceeds to operation S640. Otherwise (S730=No), the method proceeds to operation S740.

In operation S740, a read retry count RRC is increased by 1. In operation S750, memory controller 3200 determines whether the read retry count RRC exceeds a predetermined value. If the determination is negative (S750=No), the method proceeds to operation S700. Otherwise (S750=Yes), the method proceeds to operation S760. In operation S760, an SLC read fail flag is generated. A procedure associated with generation of the SLC read fail flag may be determined variously. Then, the method ends.

In certain embodiments, an operation of judging an error skip state can be performed prior to an SLC read operation. In this case, when determined to be an error skip state, the SLC read operation and a data setup operation may be performed. If determined not to be an error skip state, operations S600 and S620 to S760 may be performed sequentially.

Figure 12:
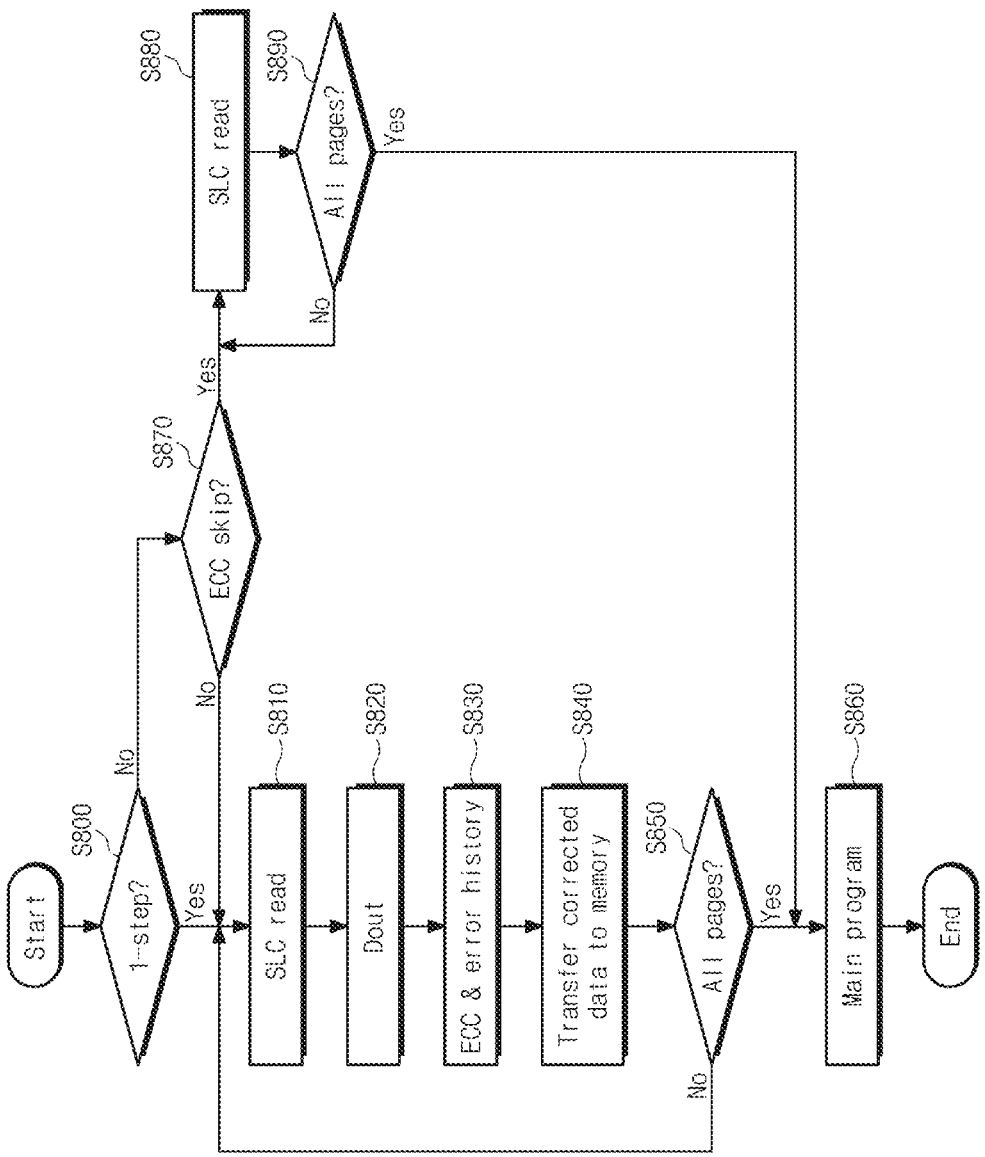
FIG. 12 is a flowchart for describing a main program operation of a memory system according to still another embodiment of the inventive concept.

FIG. 12 is a flowchart for describing a main program operation of a memory system according to still another embodiment of the inventive concept.

Referring to FIG. 12, in operation S800, memory controller 3200 determines whether a required main program operation is a 1-step program operation. Herein, the 1-step program operation may be 1-step programming or coarse programming described with reference to FIGS. 1A and 1B or 1-step programming described with reference to FIG. 1C.

Where the determination of operation S800 is affirmative (S800=Yes), the method proceeds to operation S810. Otherwise (S800=No), the method proceeds to operation S870.

In operation S810, data is read from a selected page of first memory region 3101 via page buffer 3103. Then, in operation S820, the read data is sent to memory controller 3200. Next, in operation S830, memory controller 3200 performs an error detecting and correcting operation on the input data. At this time, error history information associated with the error detecting and correcting operation may be managed under the control of memory controller 3200. The error history information may include the number of detected error bits. In operation S840, corrected data is transferred to a multi-bit memory device 3100 through a random data input operation. Set-up on transferred data is performed within page buffer 3103 for programming of a main region 3102. For example, the transferred data may be stored at specific latches of page buffer 3103.

In operation S850, memory controller 3200 determines whether an SLC read operation on pages associated with the 1-step program operation is ended. If so (S850=Yes), the method proceeds to operation S860. Otherwise (S850=No), it proceeds to operation S810. In operation S860, a main program operation is performed using data stored at page buffer 3103.

In operation S870, memory controller 3200 determines whether an error detecting and correcting operation on the required main program operation is capable of being skipped. Whether an error detecting and correcting operation on the required main program operation is capable of being skipped may be determined according to the above-described error history information. As described above, the error history information may include the number of error bits detected at an error detecting and correcting operation associated with the 1-step program operation. Where the number of error bits detected at an error detecting and correcting operation associated with the 1-step program operation is below a predetermined value, an error detecting and correcting operation associated with 2-step and 3-step program operations may be skipped. Thus, where the determination of operation S870 is negative (S870=No), the method proceeds to operation S810. Otherwise (S870=Yes), the method proceeds to operation S880.

In operation S880, data is read from a selected page of first memory region 3101 via page buffer 3103. The read data may be set up in page buffer 3103. In operation S890, memory controller 3200 determines whether an SLC read operation on pages associated with the 2-step/3-step program operation is ended. Where the determination of S890 is negative (S890=No), the method proceeds to operation S880. Otherwise (S890=Yes), the method proceeds to operation S860. In operation S860, a main program operation is performed using data stored in page buffer 3103.

As indicated by the above description, it is possible to skip an error detecting and correcting operation associated with the 2-step and 3-step program operations according to error history information managed at the 1-step program operation.

In some embodiments, it is assumed that the number of error bits included in a first page of data read at a 1-step program operation does not exceed a reference value and the number of error bits included in second and third pages of data read at a 1-step program operation exceeds the reference value. Under these circumstances, in the 2-step and 3-step program operations, an error detecting and correcting operation on a first page of data may be skipped, and an error detecting and correcting operation on second and third pages of data may be performed.

In some embodiments, an SLC read operation, a data output and correction operation, and a random data input operation associated with 1-step programming may be performed according to a sequential method or a cache method described with reference to FIG. 4B.

Figure 13:
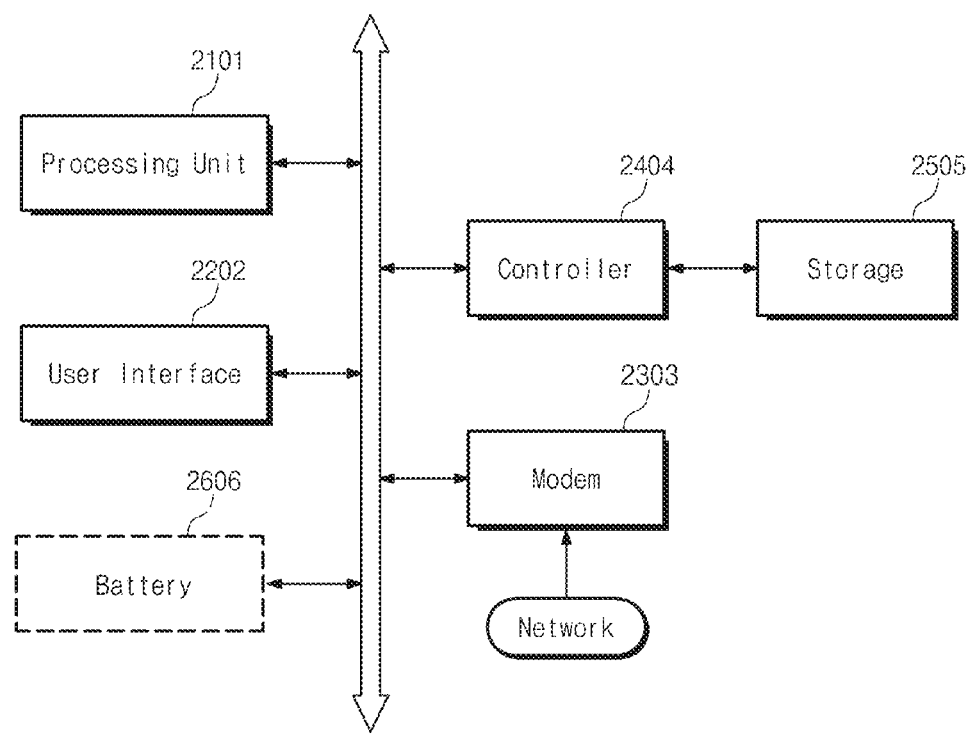
FIG. 13 is a block diagram of a computing system according to an embodiment of the inventive concept.

FIG. 13 is a block diagram of a computing system according to an embodiment of the inventive concept.

Referring to FIG. 13, the computing system comprises a processing unit 2101, a user interface 2202, a modem 2303 such as a baseband chipset, a memory controller 2404, and a nonvolatile memory device 2505 as a storage media. Nonvolatile memory device 2505 may be configured similar to the nonvolatile memory device illustrated in FIG. 2. Accordingly, memory controller 2404 may selectively determine an error correction operation on data read via an SLC read operation.

In case that the error correction operation is skipped, an output of read data to memory controller 2404 is skipped. This means that the performance of a computing system is improved and power consumption thereof is reduced. N-bit data (N being 1 or more integer) processed/to be processed by processing unit 2101 is stored in nonvolatile memory device 2505 through memory controller 2404. Where the computing system is a mobile device, a battery 2606 is further included in the computing system to supply an operating voltage thereto. Although not illustrated in FIG. 12, the computing system may further comprise an application chipset, a camera image processor (CIS), a mobile DRAM, and the like.

Figure 14:
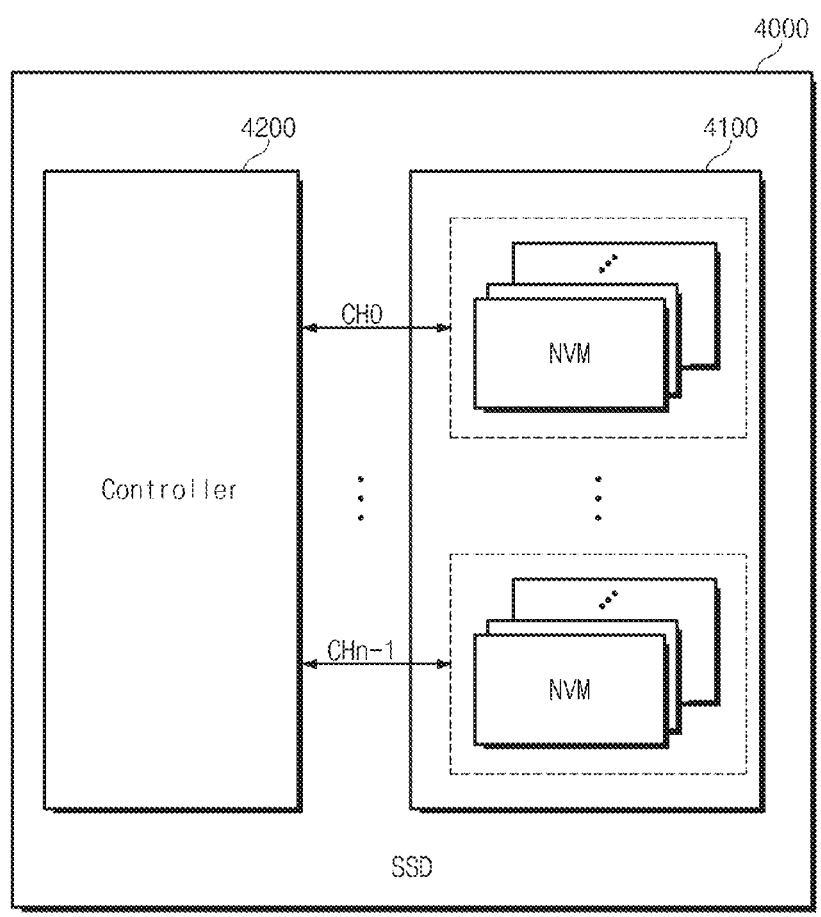
FIG. 14 is a block diagram of a solid state drive according to an embodiment of the inventive concept.

FIG. 14 is a block diagram of an SSD 4000 according to an embodiment of the inventive concept.

Referring to FIG. 13, SSD 4000 comprises a storage media 4100 and a controller 4200. Storage media 4100 is connected with controller 4200 via a plurality of channels each connected in common to a plurality of nonvolatile memories. Each nonvolatile memory device and memory controller 4200 may be configured the same as illustrated in FIG. 2. That is, memory controller 4200 may selectively determine an error correction operation on data read via an SLC read operation. In case that the error correction operation is skipped, an output of read data to memory controller 4200 is skipped. This can improve the performance of a computing system and reduce its power consumption.

Figure 15:
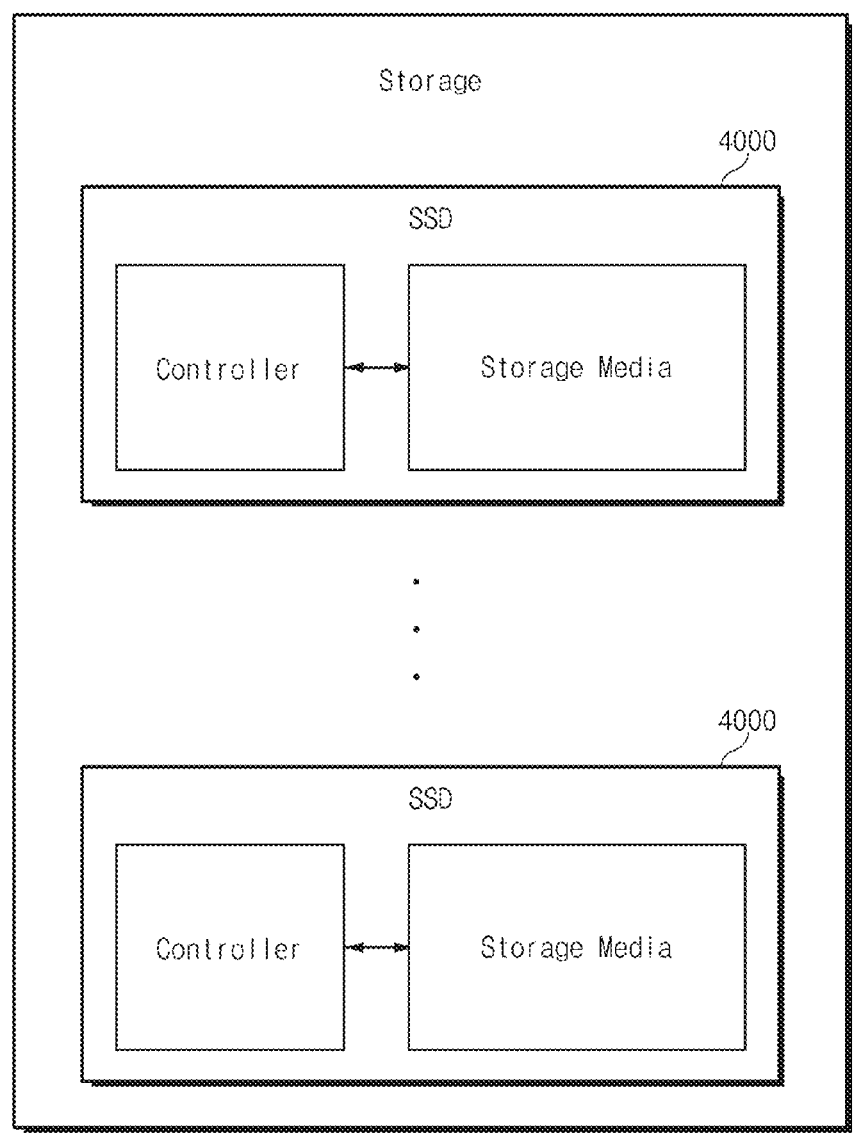
FIG. 15 is a block diagram of a data storage apparatus incorporating the solid state drive of FIG. 14.
Figure 16:
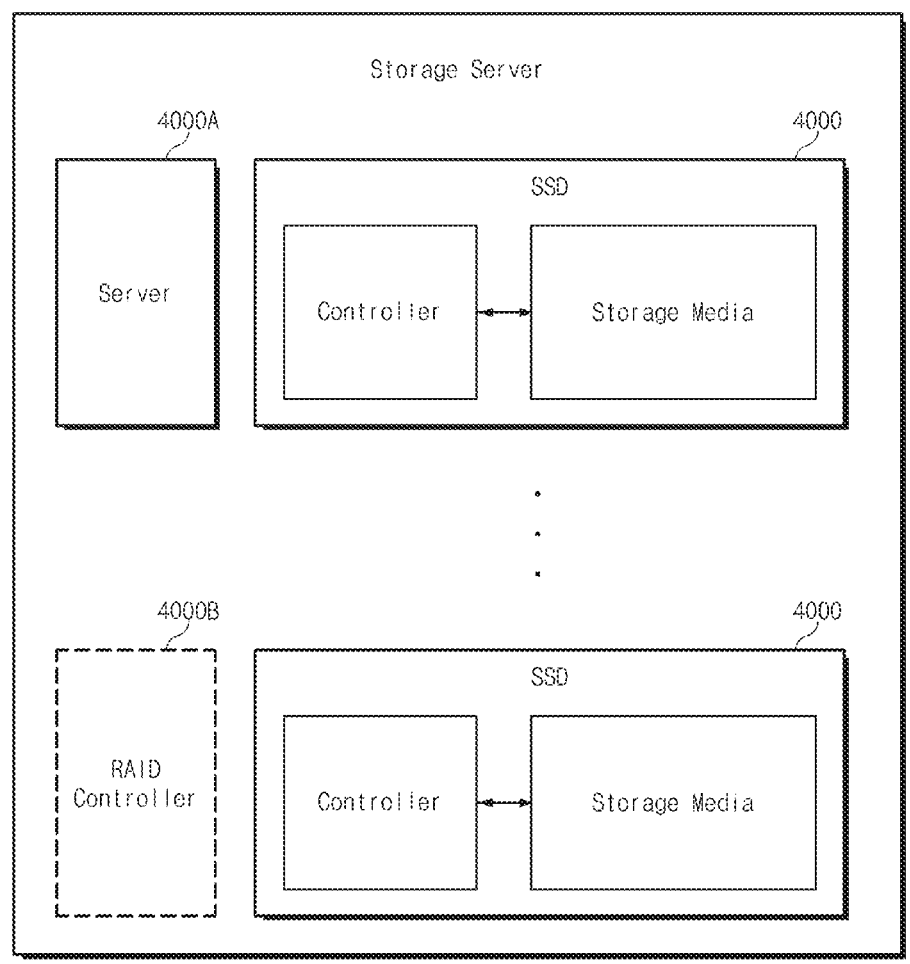
FIG. 16 is a block diagram of a storage server incorporating the solid state drive of FIG. 14.

FIG. 15 is a block diagram of a data storage apparatus incorporating SSD 4000 of FIG. 14, and FIG. 16 is a block diagram of a storage server incorporating SSD 4000 of FIG. 14.

In the example of FIG. 15, the data storage apparatus comprises a plurality of solid state drives 4000. In the example of FIG. 16, the storage server comprises a plurality of SSDs 4000 and a server 4000A. Further, it is well comprehended that a well-known RAID controller 4000B is provided in the storage server.

Figure 17:
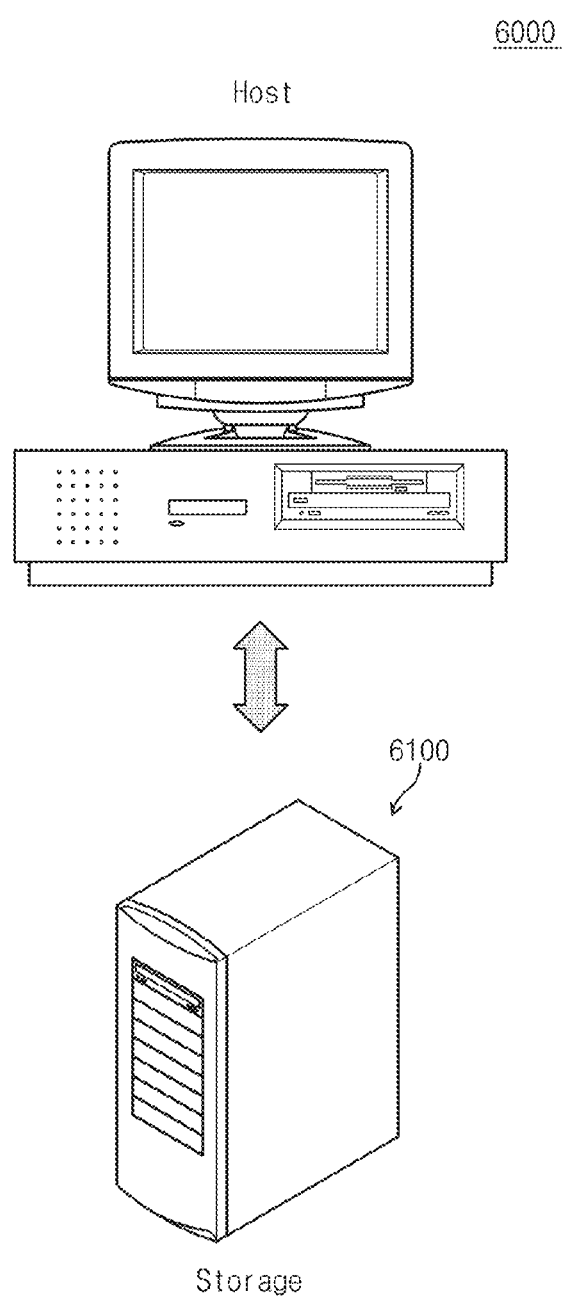
FIGS. 17 to 19 are diagrams of various systems that may incorporate a data storage device according to embodiments of the inventive concept.
Figure 18:
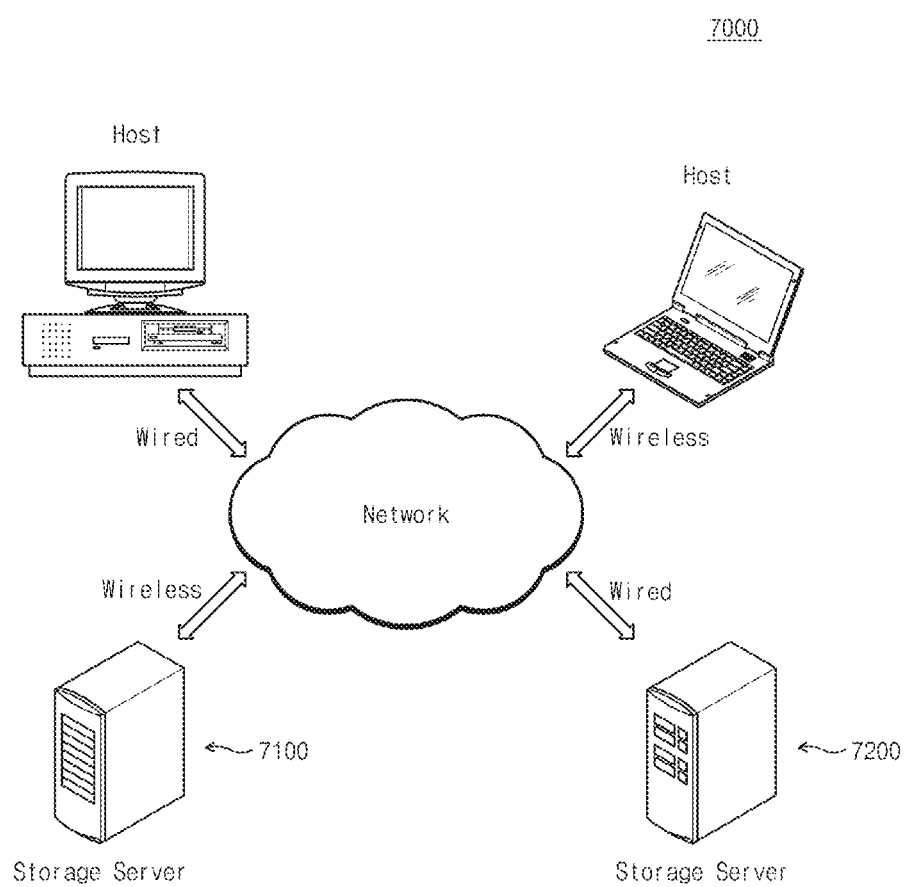
Figure 19:
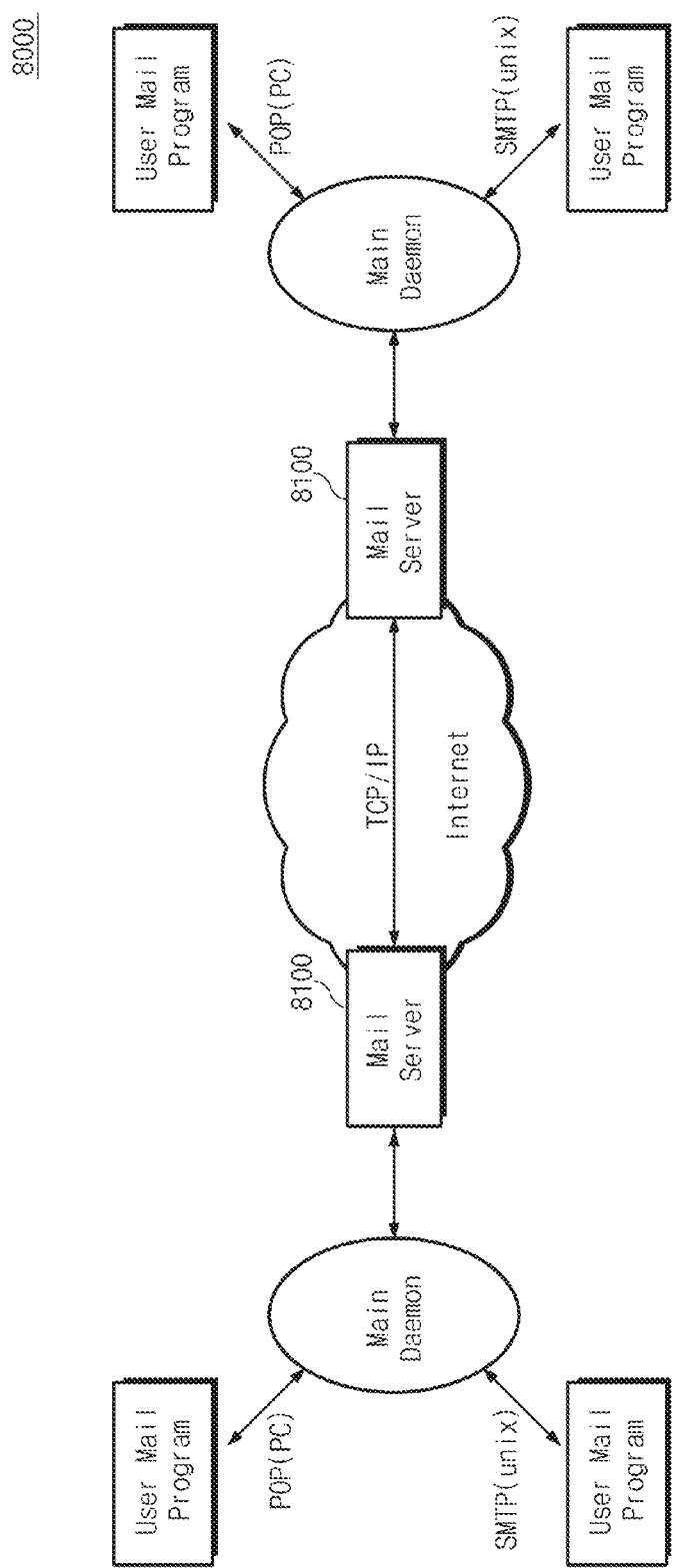

FIGS. 17 to 19 are diagrams of various systems that may incorporate a data storage device according to embodiments of the inventive concept.

As illustrated in FIG. 17, a system 6000 comprises a storage 6100 which communicates with a host by a wired or wireless method. Where a solid state drive including a data storage device according to an embodiment of the inventive concept is applied to a storage server, as illustrated in FIG. 18, a system 7000 includes storage servers 7100 and 7200 which communicate with a host by a wire or wireless method. Further, as illustrated in FIG. 19, a solid state drive including a data storage device according to an embodiment of the inventive concept can be applied to a mail server 8100.

Figure 20:
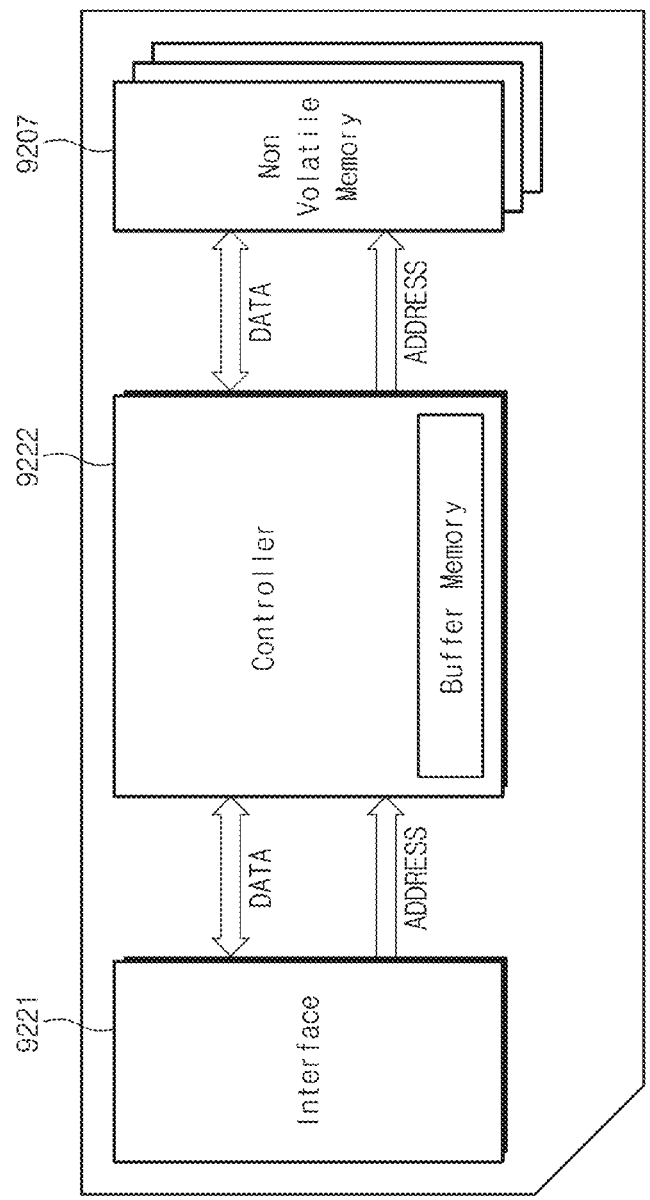
FIG. 20 is a block diagram of a memory card according to an embodiment of the inventive concept.

FIG. 20 is a block diagram of a memory card according to an embodiment of the inventive concept. A memory card, for example, may be an MMC card, an SD card, a multiuse card, a micro-SD card, a memory stick, a compact SD card, an ID card, a PCMCIA card, an SSD card, a chip-card, a smartcard, an USB card, or the like.

Referring to FIG. 20, the memory card may comprise an interface circuit 9221 for interfacing with an external device, a controller 9222 including a buffer memory and controlling an operation of the memory card, and at least one nonvolatile memory device 9207. Controller 9222 may be a processor which is configured to control write and read operations of non-volatile memory device 9207. In particular, controller 9222 may be coupled with the non-volatile memory device 9207 and interface circuit 2221 via a data bus and an address bus. Controller 9222 and non-volatile memory device 9207 may correspond to a controller and a nonvolatile memory device described in FIG. 2, respectively. For example, memory controller 9222 selectively determines an error correction operation on data read via an SLC read operation. Where the error correction operation is skipped, an output of read data to memory controller 9222 is skipped. This can improve the performance and power consumption of a computing system.

Figure 21:
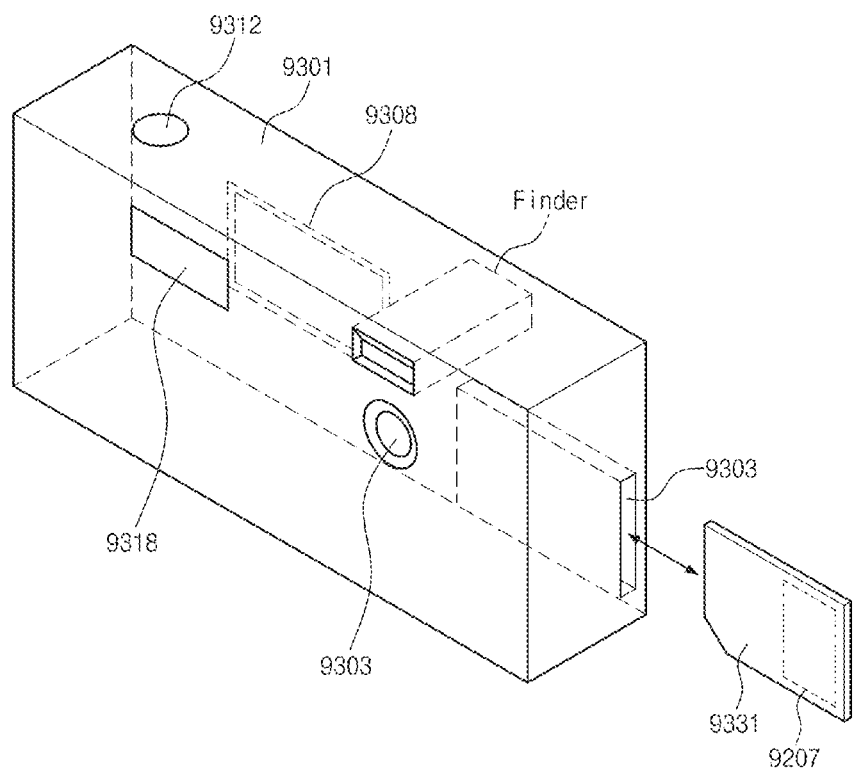
FIG. 21 is a block diagram of a digital still camera according to an embodiment of the inventive concept.

FIG. 21 is a block diagram of a digital still camera according to an embodiment of the inventive concept.

Referring to FIG. 21, the digital still camera comprises a body 9301, a slot 9302, a lens 9303, a display circuit 9308, a shutter button 9312, a strobe 9318, and the like. A memory card 9331 is inserted in slot 9308 and comprises a memory controller and a nonvolatile memory device described in FIG. 2. The memory controller in memory card 9331 selectively determines an error correction operation on data read via an SLC read operation. Where the error correction operation is skipped, an output of read data to the memory controller is skipped, which can improve performance and power consumption as described above.

If memory card 9331 has a contact type, an electric circuit on a circuit board is electrically contacted with memory card 9331 when it is inserted in slot 9308. Where memory card 9331 has a non-contact type, an electric circuit on a circuit board communicates with memory card 9331 in a radio-frequency method.

Figure 22:
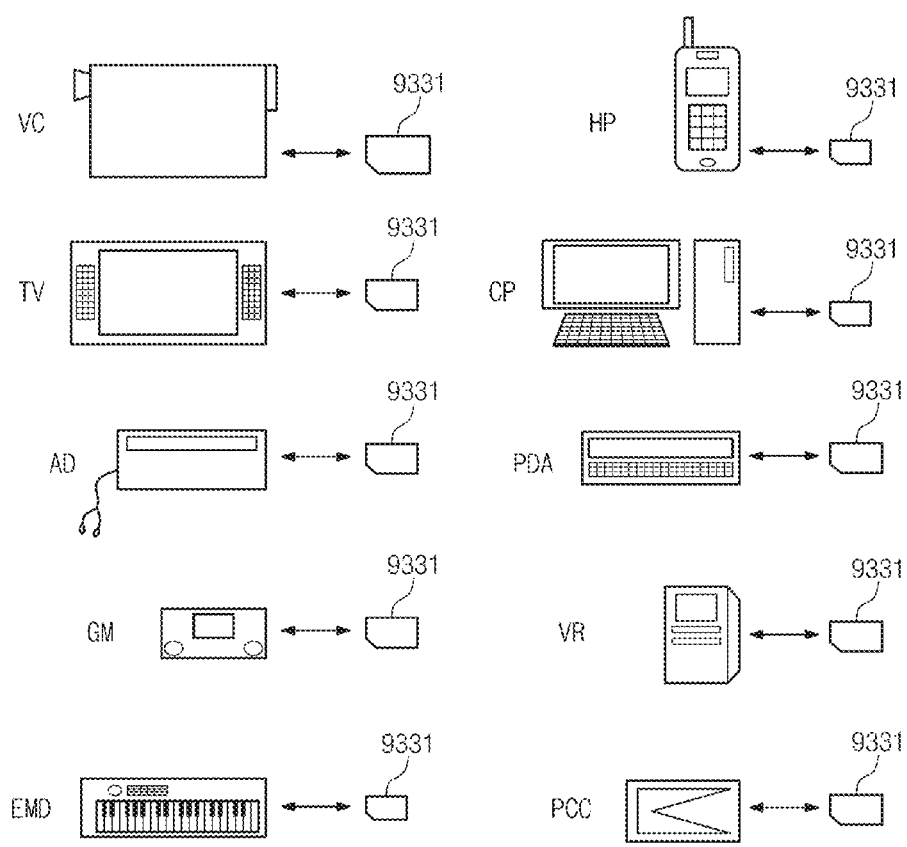
FIG. 22 is a diagram of various systems configured to use the memory card of FIG. 21.

FIG. 22 is a diagram of various systems to which a memory card in FIG. 20 is applied.

Referring to FIG. 21, a memory card 9331 may be applied to a video camera VC, a television TV, an audio device AD, a game machine GM, an electronic music device EMD, a cellular phone HP, a computer CP, a Personal Digital Assistant PDA, a voice recorder VR, a PC card PCC, and the like.

In some embodiments, memory cells can be formed of a variable resistance memory cell. An exemplary variable resistance memory cell and a memory device including the same are disclosed in U.S. Pat. No. 7,529,124, the subject matter of which is hereby incorporated by reference.

In some embodiments, memory cells are formed of one of various cell structures having a charge storage layer. Cell structures having a charge storage layer include a charge trap flash structure using a charge trap layer, a stack flash structure in which arrays are stacked in a multiple layer, a source-drain free flash structure, a pin-type flash structure, etc.

A memory device having a charge trap flash structure as a charge storage layer is disclosed in U.S. Pat. No. 6,858,906 and U.S. Publication Nos. 2004/0169238 and 2006/0180851, the subject matter of which is hereby incorporated by reference. A source-drain free flash structure is KR Patent No. 673,020, the subject matter of which is hereby incorporated by reference.

A nonvolatile memory device and/or a memory controller according to the inventive concept may be packed using various types of packages. For example, A non-volatile memory device or a memory controller according to the inventive concept may be packed using packages such as Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A memory system, comprising:
   a nonvolatile memory device comprising a memory cell array comprising first and second memory blocks; and
   a memory controller configured to control the nonvolatile memory device to read data from the first memory block to a page buffer of the nonvolatile memory device,
   wherein the memory controller is configured to perform error correction operation for the data transferred from the nonvolatile memory device, and
   wherein the memory controller is further configured to skip to transfer the data in the memory controller into the nonvolatile memory device when an error bit number of the data does not exceed a reference value, and the data in the page buffer is programmed into the second memory block.

2. The memory system of claim 1, wherein the error correction operation is performed according to whether a combination of a wearing index of the first memory block and a wearing index of the second memory block has reached a reference condition.

3. The memory system of claim 1, wherein the error correction operation is performed according to a number of program-erase cycles of the first memory block and a wearing index of the second memory block.

4. The memory system of claim 1, wherein the error correction operation is performed according to a wearing index of the first memory block and a number of program-erase cycles of the second memory block.

5. A memory system, comprising:
   a nonvolatile memory device comprising a memory cell array comprising first and second memory blocks; and
   a memory controller configured to control the nonvolatile memory device to read data from the first memory block, selectively perform an error correction operation on the data after it is read from the first memory block based on a state of at least one of the first and second memory blocks, and then store the data in the second memory block,
   wherein the error correction operation comprises performing an error detecting and correcting operation on a portion of the data and determining whether an error bit number of the portion exceeds a reference value.

6. The memory system of claim 5, wherein if the error bit number of the portion does not exceed the reference value, the memory controller skips an error detecting and correcting operation of a remainder of the data.

7. The memory system of claim 6, wherein if the error bit number of the partial data exceeds the reference value, the memory controller performs an error detecting and correcting operation on the remainder of the data.

8. The memory system of claim 1, wherein the error correction operation comprises performing error detection and correction on the data read from the first memory block and determining whether the error detection and correction is passed.

9. The memory system of claim 8, wherein where the error detection and correction is determined to be failed, the memory controller controls the nonvolatile memory device to perform a data recover read operation on the first memory block; and wherein where an error detecting and correcting operation of data read in the data recover read operation is passed, the memory controller sends error-corrected data to the nonvolatile memory device.

10. The memory system of claim 9, wherein where the error detecting and correcting operation of data read in the data recover read operation is failed, the memory controller controls the nonvolatile memory device to a read retry operation on the first memory block; and wherein where an error detecting and correcting operation of data read in the read retry operation is passed, the memory controller sends error-corrected data to the nonvolatile memory device.

11. The memory system of claim 1, wherein each of memory cells of the first memory block stores single-bit data, and each of memory cells of the second memory block stores multi-bit data.

12. The memory system of claim 11, wherein data is moved from the first memory block to the second memory block of the memory cell using a main program operation of an on-chip buffered program operation.

13. A method of operating a nonvolatile memory device, comprising:

reading data from a first memory block of the nonvolatile memory device to a page buffer of the nonvolatile memory block;

transferring the data in the nonvolatile memory device to a memory controller and performing error correction operation on the transferred data; and if an error bit number of the data does not exceed a reference value, programming the data in the page buffer into a second memory block without transferring the data in the memory controller into the nonvolatile memory device.

14. The method of claim 13, wherein the error correction operation is performed according to whether a number of program-erase cycles of the first memory block has reached a reference value.

15. The method of claim 13, wherein the error correction operation is performed according to whether a combination of a number of program-erase cycles of the first memory block and a number of program-erase cycles of the second memory block meets a reference condition.

16. The method of claim 13, wherein the error correction operation is performed according to whether a wearing index of the first memory block has reached a reference value.

17. The method of claim 13, wherein the error correction operation is performed according to whether a combination of a wearing index of the first memory block and a wearing index of the second memory block has reached a reference condition.

* * * * *